US008610332B2

(12) United States Patent
Fleming

(10) Patent No.: US 8,610,332 B2
(45) Date of Patent: Dec. 17, 2013

(54) POSITIONING SYSTEM AND METHOD

(75) Inventor: Andrew Fleming, Callanghan (AU)

(73) Assignee: Newcastle Innovation Limited (AU)

( * ) Notice: Subject to any disclaimer, the term of this patent is extended or adjusted under 35 U.S.C. 154(b) by 405 days.

(21) Appl. No.: 13/123,523

(22) PCT Filed: Oct. 9, 2009

(86) PCT No.: PCT/AU2009/001338
§ 371 (c)(1),
(2), (4) Date: Apr. 9, 2011

(87) PCT Pub. No.: WO2010/040185
PCT Pub. Date: Apr. 15, 2010

(65) Prior Publication Data
US 2011/0193510 A1    Aug. 11, 2011

(30) Foreign Application Priority Data
Oct. 9, 2008 (AU) .................................. 2008905249

(51) Int. Cl.
*H01L 41/09* (2006.01)
*H01L 41/113* (2006.01)

(52) U.S. Cl.
USPC ........................... 310/317; 310/318; 310/338

(58) Field of Classification Search
USPC ..................... 310/314, 316.01, 317, 318, 338
See application file for complete search history.

(56) References Cited

U.S. PATENT DOCUMENTS

| | | |
|---|---|---|
| 4,559,717 A | 12/1985 | Scire et al. |
| 4,578,607 A | 3/1986 | Tojo et al. |
| 4,615,591 A | 10/1986 | Smith et al. |
| 4,644,213 A | 2/1987 | Shibuya |
| 4,667,415 A | 5/1987 | Barsky |
| 4,691,586 A | 9/1987 | Van Leijenhorst et al. |
| 4,843,293 A | 6/1989 | Futami |
| 4,874,978 A | 10/1989 | Sakaida et al. |
| 5,030,901 A | 7/1991 | Futami |
| 5,179,525 A | 1/1993 | Griffis et al. |
| 5,187,876 A | 2/1993 | Hatheway |
| 5,210,410 A | 5/1993 | Barrett |
| 5,281,884 A | 1/1994 | Basavanhally et al. |
| 5,360,974 A | 11/1994 | Hammond et al. |

(Continued)

FOREIGN PATENT DOCUMENTS

| | | |
|---|---|---|
| CN | 1731081 | 2/2006 |
| CN | 1996737 | 7/2007 |

(Continued)

OTHER PUBLICATIONS

International Search Report for PCT/AU2009/001338, Completed by the Australian Patent Office on Nov. 11, 2009, 2 Pages.

(Continued)

*Primary Examiner* — Thomas Dougherty
(74) *Attorney, Agent, or Firm* — Brooks Kushman P.C.

(57) ABSTRACT

A system for positioning an object, having a fixed base, a support for the object, an actuator for applying a force to displace the support relative to the fixed base, a sensor for measuring the load force on the support, and a controller for processing the measured load force to control the position of the support and/or damp at least one resonance frequency of the system. A method of controlling the system is also provided.

41 Claims, 12 Drawing Sheets

(56) References Cited

U.S. PATENT DOCUMENTS

| | | | |
|---|---|---|---|
| 5,543,614 A | 8/1996 | Miyamoto et al. | |
| 5,557,156 A | 9/1996 | Elings | |
| 5,610,686 A | 3/1997 | Osanai | |
| 5,808,302 A | 9/1998 | Binnig et al. | |
| 5,812,420 A | 9/1998 | Takahashi | |
| 5,903,085 A | 5/1999 | Karam | |
| 6,246,052 B1 | 6/2001 | Cleveland et al. | |
| 6,453,566 B1 | 9/2002 | Bottinelli et al. | |
| 6,467,761 B1 | 10/2002 | Amatucci et al. | |
| 6,555,829 B1 | 4/2003 | Spallas et al. | |
| 6,617,754 B1 | 9/2003 | Knauss | |
| 6,638,625 B1 | 10/2003 | Draeger | |
| 6,688,183 B2 | 2/2004 | Awtar et al. | |
| 6,720,551 B2 | 4/2004 | Cleveland et al. | |
| 6,736,361 B2 | 5/2004 | Price | |
| 6,817,104 B2 | 11/2004 | Kaneko et al. | |
| 6,820,495 B2 | 11/2004 | Wallis et al. | |
| 6,836,968 B1 | 1/2005 | Walker et al. | |
| 6,839,970 B2 | 1/2005 | Montesanti et al. | |
| 6,871,548 B2 | 3/2005 | Helmer et al. | |
| 6,906,450 B2 * | 6/2005 | Tamayo De Miguel et al. | 310/317 |
| 6,920,696 B2 | 7/2005 | Sawada et al. | |
| 6,940,277 B2 | 9/2005 | Fries | |
| 6,950,050 B1 | 9/2005 | Jordan | |
| 7,093,827 B2 | 8/2006 | Culpepper | |
| 7,239,107 B1 | 7/2007 | Ferreira et al. | |
| 7,270,319 B2 | 9/2007 | Culpepper | |
| 7,275,332 B2 | 10/2007 | Blanding | |
| 7,348,709 B2 | 3/2008 | Xu | |
| 7,685,733 B2 * | 3/2010 | Ohmori et al. | 33/559 |
| 2005/0247874 A1 * | 11/2005 | Ando et al. | 250/306 |
| 2006/0138871 A1 | 6/2006 | Rakhovsky | |
| 2007/0043451 A1 | 2/2007 | Geyer | |
| 2009/0235396 A1 * | 9/2009 | Wang et al. | 850/6 |

FOREIGN PATENT DOCUMENTS

| | | | | |
|---|---|---|---|---|
| JP | 61-216110 A | * | 9/1988 | 310/338 |
| JP | 04125693 | | 4/1992 | |
| JP | 04259015 | | 9/1992 | |
| JP | 2000237932 A | | 9/2000 | |
| JP | 2005190228 | | 7/2005 | |
| WO | 0245891 A1 | | 6/2002 | |

OTHER PUBLICATIONS

Australian Patent Office International-Type Search Report, Date of Request for international-type search Jan. 27, 2009, 2 Pages.

Japanese Office Action for JP 2011-530331, Dated Sep. 17, 2013, English Summary attached to original, All together 8 pages.

* cited by examiner

POSITIONING SYSTEM AND METHOD

CROSS-REFERENCE TO RELATED APPLICATION

This application is the U.S. national phase of PCT Appln. No. PCT/AU2009/001338 filed Oct. 9, 2009 which claims priority to Australian application 2008905249 filed Oct. 9, 2008, the disclosures of which are incorporated in their entirety by reference herein.

FIELD OF THE INVENTION

The present invention relates to a positioning method and system and in particular a method and system for nanopositioning apparatuses.

The invention has been developed primarily for use in a nanopositioning system or apparatus, and will be described hereinafter with reference to this application. However, it will be appreciated that the invention is not limited to this particular field of use. In particular, it is contemplated that the invention is also applicable to positioning systems, apparatuses and methods where precise and accurate displacements of an object mounted in the positioning system or to a positioning apparatus are required.

BACKGROUND TO THE INVENTION

The following discussion of the prior art is intended to present the invention in an appropriate technical context and allow its significance to be properly appreciated. Unless clearly indicated to the contrary, however, reference to any prior art in this specification should not be construed as an admission that such art is widely known or forms part of common general knowledge in the field.

Nanopositioning systems and apparatuses are used to generate fine mechanical displacements with resolution frequently down to the atomic scale. Such systems and apparatuses include fiber aligners, beam scanners, and lateral positioning platforms. Other applications of nanopositioning apparatuses in nanotechnology include scanning probe microscopy (SPM), scanning tunnelling microscopy (STM), atomic force microscopy (AFM), nanofabrication systems, precision machining, optical switching and cell physiology research.

Due to their high stiffness, compact size and effectively infinite resolution, piezoelectric actuators are universally employed in nanopositioning applications to provide the greatest possible positioning accuracy, which is also known as tracking performance. In practice, however, the positioning accuracy of piezoelectric actuators is severely limited by hysteresis over relatively large displacements and creep at low frequencies. Hysteresis occurs where the platform position becomes a function of the past history of its movement. This is due to the piezoelectric response to an input voltage being a function of the previous voltage history. Creep occurs when the platform slowly drifts in the direction of recent movements. These slow drifts in position occur due to previous input voltages applied to the nanopositioning apparatus. As a result, all nanopositioning systems typically require some form of feedback or feedforward control to reduce non-linearity caused by hysteresis and creep.

Another difficulty with nanopositioning systems is mechanical resonance, which arises from the platform mass interacting with the finite stiffness of the support flexures, mechanical linkages and/or actuator. Mechanical resonance introduces unwanted vibrations into the nanopositioning system, thus affecting its positioning accuracy, scanning speed and stability. Thus, the frequency of driving signals is limited to around 1% to 10% of the resonance frequency. This necessarily restricts the closed-loop bandwidth of the nanopositioning system.

One of the most popular techniques for control of nanopositioning systems is sensor-based feedback using integral or proportional integral control. However, the bandwidth of integral tracking control is severely limited by the presence of highly resonant modes and sensor-induced noise. It has been proposed to improve the closed-loop bandwidth by using either inversion of resonance dynamics with a notch filter or suspension of resonance dynamics using a damping controller.

However, each of these proposed solutions suffer drawbacks. Inversion based techniques suffer from the disadvantage of requiring an accurate system model. For example, if the resonance frequency of the system shifts by only 1%, a high-gain inversion based feedback controller can become unstable. In most applications this is unacceptable as the load mass and hence resonance frequency of a nanopositioning apparatus can vary significantly during service. As a result of this sensitivity, high-performance inversion based controllers are typically only applied in niche applications where the resonance frequency is stable, or when the feedback controller can be continually recalibrated.

Attempts to improve the performance of nanopositioning systems and methods frequently utilise damping techniques to actively damp the first resonance mode. This can reduce settling time, allows a proportional increase in scan speed and facilitates greater tracking performance, since the tracking controller gain can be increased.

Damping controllers are adequate to reduce the bandwidth limitations caused by mechanical resonance, but the tracking controller gain is still limited by stability margins and positioning accuracy remains dominated by sensor-induced noise.

SUMMARY OF THE INVENTION

A first aspect of the invention provides a system for positioning an object, comprising:
a fixed base;
a support for the object;
an actuator for applying a force to displace the support relative to the fixed base;
a sensor for measuring the load force on the support, and
a controller for processing the measured load force to control the position of the support and/or damp at least one resonance frequency of the system.

Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

Preferably, the controller processes the measured load force in a feedback loop.

Preferably, the controller adjusts the position of the support in response to the measured load force. Preferably, the controller controls the actuator to adjust the position of the support.

Preferably, the controller calculates the displacement of the support from the measured load force. Preferably, the displacement of the support is calculated by the relationship:

$$\frac{d}{F} = \frac{1}{M_P s^2 + c_f s + k_f}$$

where d is the displacement of the support;
F is the measured load force;
$M_p$ is the mass of the support;
s is the Laplace transform parameter;
$c_f$ is the flexure damping ratio; and
$k_f$ is the flexure stiffness.

Preferably, the force sensor generates an output voltage corresponding to the measured load force. More preferably, the displacement of the support is calculated as a proportion of the output voltage of the force sensor. In one preferred form, the displacement of the support is calculated by the relationship:

$$\frac{d}{V_s} = \frac{d}{g_s F} = \frac{1/g_s}{M_P s^2 + c_f s + k_f}$$

where d is the displacement of the support;
$V_s$ is the output voltage of the measured load force;
F is the measured load force;
$g_s$ is the force sensor gain;
$M_p$ is the mass of the support;
s is the Laplace transform parameter;
$c_f$ is the flexure damping ratio; and
$k_f$ is the flexure stiffness.

Preferably, the force sensor is calibrated using the charge and/or the voltage of the force sensor.

Preferably, the controller processes the measured load force in the feedback loop at frequencies above a predetermined cross-over frequency $\omega_c$. Preferably, the cross-over frequency is above a cut-off frequency of the force sensor. In one preferred form, the cross-over frequency is determined according to the relationship:

$$\omega_c > \omega_{co} = \frac{1}{R_{in} C}$$

where $\omega_c$ is the cross-over frequency;
$\omega_{co}$ is the cut-off frequency;
$R_{in}$ is the voltage buffer input impedance, and
C is the capacitance of the force sensor.

Preferably, the system comprises a position sensor for measuring the position of the support. More preferably, the measured support position is used to calculate the displacement of the support. Alternatively, the controller calculates the displacement of the support from the input voltage of the actuator and the open-loop response of the system. In either case, it is preferred that the controller processes the calculated displacement in the feedback loop at frequencies below the cross-over frequency $\omega_c$.

Preferably, the system comprises a displacement sensor for measuring the displacement of the support. More preferably, the controller processes the measured displacement in the feedback loop at frequencies below the cross-over frequency $\omega_c$.

Preferably, the controller processes the measured load force in the feedback loop to increase the damping ratio of the system.

Preferably, the at least one resonance frequency is the first resonance mode of the system. Preferably, the system comprises multiple resonance modes and the controller damps one or more resonance modes of the system.

Preferably, the force sensor is interposed at least partially between the support and the actuator. Preferably, the force sensor is a piezoelectric transducer.

Preferably, the controller adds a feedforward input to the feedback loop to improve the closed-loop response of the system.

A second aspect of the invention provides a method of controlling a system for positioning an object, the system comprising a fixed base, a support for the object and an actuator for applying a force to the support, the method comprising the steps of:

actuating the actuator to apply the force to displace the support relative to the fixed base;

measuring the load force on the support, and processing the measured load force to control the position of the support and/or damp at least one resonance frequency of the system.

It is preferred that the processing step comprises processing the measured load force in a feedback loop.

Preferably, the method comprises the step of adjusting the position of the support in response to the measured load force.
Preferably, the method comprises the step of controlling the actuator to adjust the position of the support.

Preferably, the method comprises the step of calculating the displacement of the support from the measured load force. Preferably, the displacement of the support is calculated by the relationship:

$$\frac{d}{F} = \frac{1}{M_P s^2 + c_f s + k_f}$$

where d is the displacement of the support;
F is the measured load force;
$M_p$ is the mass of the support;
s is the Laplace transform parameter;
$c_f$ is the flexure damping ratio; and
$k_f$ is the flexure stiffness.

Preferably, the load force measuring step comprises using a force sensor to measure the load force. More preferably, the force sensor generates an output voltage corresponding to the measured load force. Even more preferably, the method comprises the step of calculating the displacement of the support as a proportion of the output voltage of the force sensor. In one preferred form, the displacement of the support is calculated by the relationship:

$$\frac{d}{V_s} = \frac{d}{g_s F} = \frac{1/g_s}{M_P s^2 + c_f s + k_f}$$

where d is the displacement of the support;
$V_s$ is the output voltage of the measured load force;
F is the measured load force;
$g_s$ is the force sensor gain;
$M_p$ is the mass of the support;
s is the Laplace transform parameter;
$c_f$ is the flexure damping ratio; and
$k_f$ is the flexure stiffness.

Preferably, the method comprises the step of calibrating the force sensor using the charge and/or the voltage of the force sensor.

Preferably, the processing step comprises processing the measured load force in the feedback loop at frequencies above the cross-over frequency $\omega_c$. More preferably, the cross-over frequency $\omega_c$ is above a cut-off frequency of the force sensor. In one preferred form, the cross-over frequency $\omega_c$ is determined according to the relationship:

$$\omega_c > \omega_{co} = \frac{1}{R_{in}C}$$

where $\omega_c$ is the cross-over frequency;
$\omega_{co}$ is the cut-off frequency;
$R_{in}$ is the voltage buffer input impedance, and
C is the capacitance of the force sensor.

Preferably, the method comprises the steps of measuring the position of the support and calculating the displacement of the support from the measured support position. Alternatively, the method comprises the step of calculating the displacement of the support from the input voltage of the actuator and the open-loop response of the system. In either case, it is preferred that the method further comprises the step of processing the calculated displacement in the feedback loop at frequencies below the cross-over frequency $\omega_c$.

Preferably, the method comprises the step of measuring the displacement of the support. More preferably, the method comprises the step of processing the measured displacement in the feedback loop processes at frequencies below a predetermined cross-over frequency $\omega_c$.

Preferably, the method comprises the step of processing the measured load force in the feedback loop to increase the damping ratio of the system.

Preferably, the at least one resonance frequency is the first resonance mode of the system. Preferably, the system comprises multiple resonance modes and the controller damps one or more of the resonance modes.

Preferably, the method comprises the step of adding a feedforward input to the feedback loop to improve the closed-loop response of the system.

Preferably, the system is a nanopositioning system. That is, the system enables the precise motion and positioning of the object on the nano-scale.

In the invention, measurement of actuator load force is used as a feedback variable for both tracking (position) and/or damping control in the feedback loop. Advantageously, the use of the measured load force in the feedback control loop results in a zero-pole ordering. This allows a simple integral controller to provide excellent tracking and damping performance without any limitations on the gain. The system is thus stable with a theoretically infinite gain margin and 90 degrees phase margin. Positioning noise is also substantially reduced, as a piezoelectric force sensor generates less noise than a capacitive or inductive position sensor.

BRIEF DESCRIPTION OF THE DRAWINGS

Preferred embodiments of the invention will now be described, by way of example only, with reference to the accompanying drawings in which:

FIG. 5b is a closed-loop frequency response graph for the system of FIG. 5a;

FIG. 5c is a position noise graph for the system of FIG. 5a;

FIG. 14b is a closed-loop frequency response graph for the system of FIGS. 13 and 14a;

FIG. 14c is a position noise graph for the system of FIGS. 13 and 14a;

FIG. 16b is a closed-loop frequency response graph for the system of FIG. 16a;

FIG. 16c is a position noise graph for the system of FIG. 16a;

PREFERRED EMBODIMENTS OF THE INVENTION

A preferred application of the invention is in the field of nanopositioning systems, apparatuses and methods. Such systems and apparatuses typically have a fixed base with a movable platform or stage, with guiding flexures and/or mechanical linkages so as to constrain the movement of the platform or stage to a single degree of freedom. The object is mounted to or located on the platform or stage and the apparatus moves the platform to precisely position the object. Additional flexures and/or mechanical linkages may also be connected to the platform so that the platform can have multiple degrees of freedom, and can be constrained to move in a single degree of freedom at any one time.

As discussed above, such nanopositioning systems suffer from limitations due to hysteresis, creep and mechanical resonance. In particular, mechanical resonance limits the operation of the nanopositioning systems in terms of its positioning accuracy, speed and stability.

Figure 1:
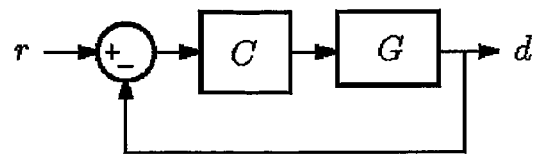
FIG. 1 is a schematic drawing of a circuit representing a typical nanopositioning system G.

As the lowest resonance mode is of greatest interest, the dynamics of a typical nanopositioning system can be approximated by a unity-gain second-order low-pass system G, controlled by an integral controller C with a gain α, as illustrated in FIG. 1 and the following equation:

$$G(s) = \frac{\omega_r^2}{s^2 + 2\omega_r \xi s + \omega_r^2} \tag{1}$$

where $\omega_r$ is the resonance frequency;
$\xi$ is the damping ratio; and
s is the Laplace transform parameter.

Figure 2A:
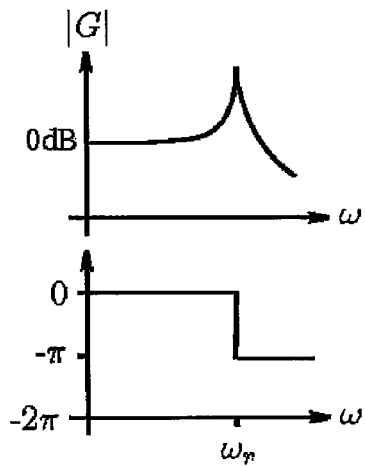
FIG. 2a are frequency response graphs of the nanopositioning system of FIG. 1.
Figure 2B:
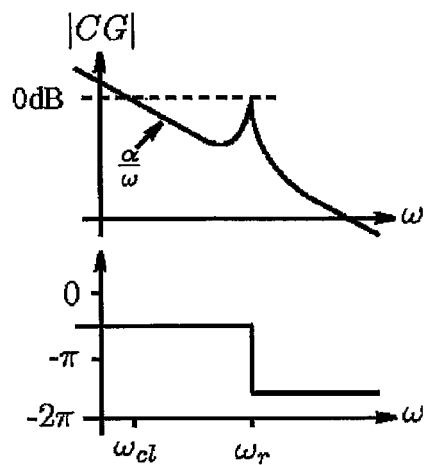
FIG. 2b are loop-gain graphs of the nanopositioning system of FIG. 1.

The magnitude and phase frequency responses of this system are plotted in FIG. 2. To avoid excitation of the mechanical resonance, the frequency of driving signals is limited to around 1% to 10% of the resonance frequency. In applications where scan frequency is the foremost performance limitation, for example, in video speed AFM, the nanopositioning systems are operated in an open-loop with driving signals that are shaped to reduce harmonic content. Although such techniques can provide a fast response, they are not accurate, as non-linearity and disturbance remain uncontrolled.

Typically, the response of nanopositioning systems and apparatuses is improved by using a sensor and feedback loop. One common technique in commercial nanopositioning systems is sensor-based feedback using integral or proportional-integral control. Such controllers are simple, robust to modeling error, and due to high loop-gain at low-frequencies, effectively reduce piezoelectric non-linearity.

However, the bandwidth of integral tracking controllers is severely limited by the presence of highly resonant modes. The cause of such limited closed-loop bandwidth can be explained by examining the loop gain in FIG. 2. The factor limiting the maximum feedback gain and closed-loop bandwidth is gain margin. At the resonance frequency $\omega_r$ the phase lag exceeds π so the loop gain must be less than 1 or 0 dB for closed-loop stability. The condition for closed-loop stability is:

$$\frac{\alpha}{\omega_r} \times \frac{1}{2\xi} > 1, \text{ or } \alpha < 2\omega_r \xi \tag{2}$$

where α is the feedback gain;
$\omega_r$ is the resonance frequency; and
$\xi$ is the damping ratio.

As the system G has unity gain, the feedback gain a is also the closed-loop bandwidth $\omega_{cl}$ (in radians per second). Thus, the maximum closed-loop bandwidth is equal to twice the product of the damping ratio $\xi$ and the resonance frequency $\omega_r$. This is a severe limitation as the damping ratio $\xi$ is usually in the order of 0.01, meaning that the maximum closed-loop bandwidth $\omega_{cl}$ is less than 2% of the resonance frequency $\omega_r$.

One technique for improving the closed-loop bandwidth is based on damped resonance dynamics using a damping controller. Damping control uses a feedback loop to artificially increase the damping ratio $\xi$ of a system. Due to equation (2), an increase in the damping ratio $\xi$ allows a proportional increase in the feedback gain and closed-loop bandwidth, thus overcoming the bandwidth limitations of mechanical resonance. Although damping controllers alone cannot increase the closed-loop bandwidth too far beyond the resonance frequency, they have the advantage of being insensitive to variations in resonance frequency. In addition, as damping controllers suppress, rather than invert, the mechanical resonance, they provide better rejection of external disturbances than inversion based systems.

Damping control is frequently combined with tracking control to improve performance of the system. However, alike all feedback control systems, the tracking controller gain is still limited by stability margins and positioning resolution is dominated by sensor-induced noise. To demonstrate the limitations imposed by sensor noise, consider a nanopositioning apparatus with feedback control derived from a high performance capacitive sensor with a range of ±100 μm and root-mean-square (RMS) noise of $$\frac{20 \text{ } pm}{\sqrt{Hz}}.$$

An estimate of the RMS positioning noise can be found by multiplying noise density by the square-root of closed-loop bandwidth; ie:

$$\text{RMS Noise} = \sqrt{\text{Bandwidth}} \times \text{Noise Density} \tag{3}$$

For example, with a closed-loop bandwidth of 100 Hz, the positioning noise is 0.2 nm RMS, or approximately 1.2 nm peak-to-peak, if the noise is normally distributed. For atomic resolution, the closed-loop bandwidth must be reduced to below 1 Hz, which is a severe limitation. Thus, high sensor-induced noise places a penalty on positioning resolution as bandwidth is increased.

Figure 3:
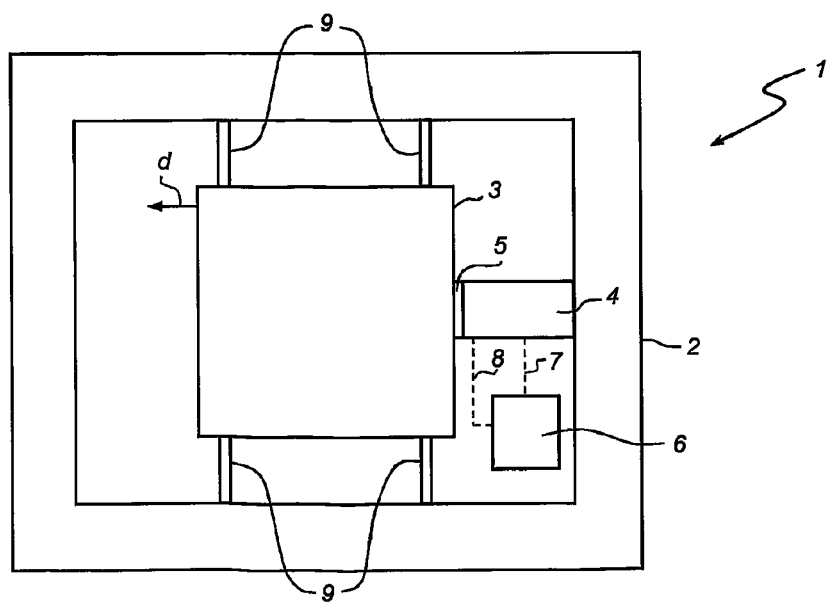
FIG. 3 is a schematic drawing of a single degree of freedom nanopositioning stage in accordance with one embodiment of the invention.

Referring to FIG. 3, one embodiment of the invention provides a system for positioning an object in the form of a nanopositioning stage 1 having a fixed base 2 and a support in the form of a platform 3 for the object (not shown). A piezoelectric actuator 4 is mounted between the fixed base 2 and the platform 3, and applies a force to displace the platform 3 relative to the fixed base 2. A sensor in the form of a piezoelectric transducer 5 for measuring the load force on the platform 3 is interposed between the platform and the actuator 4. A controller 6 is electrically connected to the actuator 4 and the piezoelectric transducer 5 via connection lines 7 and 8, respectively, and processes the measured load force to control the position of the support (and thus the object) or damp at least one resonance frequency of the system 1.

The stage 1 additionally has a plurality of flexures 9 for guiding displacement of the platform 3 so that movement of the platform is only in the direction and distance d, whilst constraining platform movement in the remaining degrees of freedom. That is, the flexures 9 ensure that the platform 3 moves slides or translates along a distance d in a single direction (ie. one degree of freedom). Mechanical linkages may be used in combination with or substitution for the flexures 9.

Figure 4:
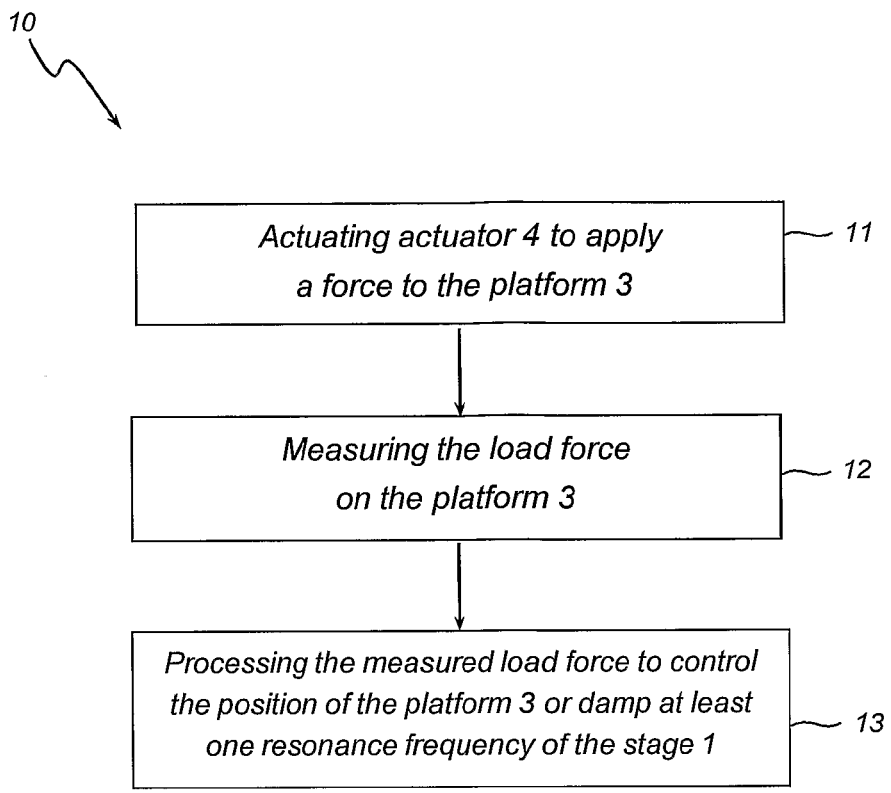
FIG. 4 is a schematic drawing of a method in accordance with one embodiment of the invention for implementation in the system of FIG. 3.

Referring now to FIG. 4, a method according to one embodiment of the invention is described, where corresponding features have been given the same reference numerals.

While the method 10 is described in relation to its implementation in the nanopositioning system 1, it will be appreciated that the method may be applicable to other positioning and nanopositioning systems than that illustrated in FIG. 3.

In the method 10, the piezoelectric actuator 4 is actuated to apply a force to the platform 3 to displace it relative to the fixed base at step 11. The piezoelectric transducer measures the load force on the platform 3 at step 12. At step 13, the measured load force is processed to control the position of the platform 3 or damp at least one resonance frequency of the system.

The inventor believes that the system 1 and the method 10 are advantageously implemented in a feedback loop of the controller 6 for both tracking (that is, positioning) and damping (bandwidth or speed) control. The invention permits the use of a simple integral controller to provide tracking and damping performance of the nanopositioning system and method without limitations on the gain.

In operation, an input signal corresponding to a desired position of the object on the platform 3 is sent to the controller 6, which converts it into a signal corresponding to the necessary displacement $d_1$. The controller 6 then actuates the piezoelectric actuator 4 through the connection line 7. The actuator 4 then applies a force to the platform 3 to displace it a distance d. The piezoelectric transducer 5 measures the load force on the platform 3 and then sends a signal corresponding to the measured load force back to the controller 6 through the connection line 8. The measured load force signal is fed into a feedback loop of the controller 6 to calculate the actual displacement $d_2$ in accordance with a predetermined proportional relationship, which will be described in more detail below. If there is a variation in the actual displacement $d_2$ of the platform 3 to the desired displacement $d_1$; that is, $d_1 \neq d_2$, then the controller 6 sends a signal through the connection line 7 to the piezoelectric actuator 4 to decrease or increase the force applied to the platform 3, and hence the load force on the platform 3, thus adjusting the position of the platform 3. Thus, the stage 1 is able to advantageously dynamically correct the platform position in response to the load force without being adversely affected by sensor-induced noise. This is because the piezoelectric transducer 5 generates much less noise than standard position sensors, such as inductive and capacitive position sensors.

Alternatively, or in addition, to the position adjustment, the controller 6 processes the measured load force in the feedback loop to increase the damping ratio $\xi$ for the stage 1. This damps or suppresses the resonance frequencies of the stage 1, especially the first (lowest frequency) resonance mode. It also proportionately increases the feedback gain and the closed-loop bandwidth of the tracking controller as its gain is increased. Consequently, the stage 1 is able to operate in a larger closed-loop bandwidth while meeting the condition for closed-loop stability approximately in accordance with equation (2). Advantageously, the controller is able to damp the resonance frequency (or frequencies where there are multiple resonance modes) of the stage 1 dynamically in response to variations in the object mass, and thus does not require calibration of the stage 1 each time an object of differing mass is mounted to the platform 3.

Referring to FIG. 5, another embodiment of the invention is illustrated, where corresponding features have been given the same reference numerals. In this embodiment, the controller 6 comprises a damping controller $C_d$ and a tracking controller $C_t$, separate from each other, and uses the measured load force to only damp the resonance frequency or frequencies of the system G. The tracking controller $C_t$ uses a displacement feedback loop to apply direct tracking of the stage 1. The displacement d must be obtained with a physical displacement sensor such as a capacitive, inductive or optical sensor.

Figure 5A:
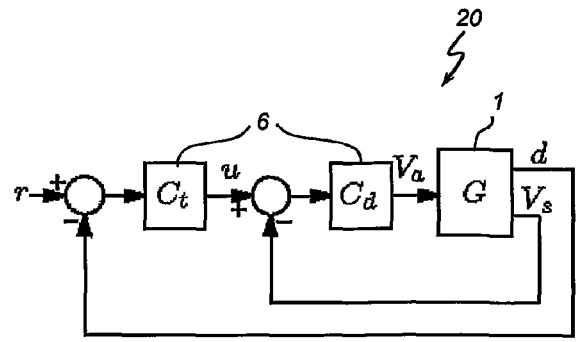
FIG. 5a is a schematic drawing of a circuit representing a nanopositioning system according to another embodiment of the invention.

The low bandwidth of the integral tracking controller $C_t$ is significantly improved by adding the internal force feedback loop of the damping controller $C_d$, as shown in FIG. 5a. As the damping controller $C_d$ eliminates the lightly damped resonance, gain-margin is drastically increased, allowing a proportional increase in tracking bandwidth. To find the closed-loop transfer function, it is first convenient to find the transfer function of the internal loop. That is, the transfer function $\widetilde{G_{du}}$ from u to d is $$\widetilde{G_{dr}} = \frac{G_{dVa}C_d}{1 + C_d G_{VsVa}} \quad (4)$$

where $G_{dVa}$ is the transfer function from the applied voltage to displacement;

$C_d$ is the damping controller using force feedback in accordance with the embodiment of the invention; and $G_{VsVa}$ is the transfer function from the applied voltage to the sensed (output) voltage.

The closed-loop response $\widetilde{G_{du}}$ from r to d is then $$\widetilde{G_{dr}} = \frac{C_t \widetilde{G_{du}}}{1 + C_t \widetilde{G_{du}}}. \quad (5)$$

or equivalently, $$\widetilde{G_{dr}} = \frac{G_{dVa} C_t C_d}{1 + C_{dVa} C_t C_d + C_d G_{VsVa}} \quad (6)$$

Figure 5B:
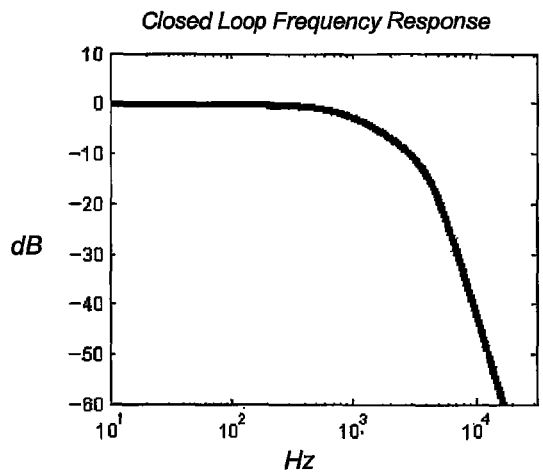
Figure 5C:
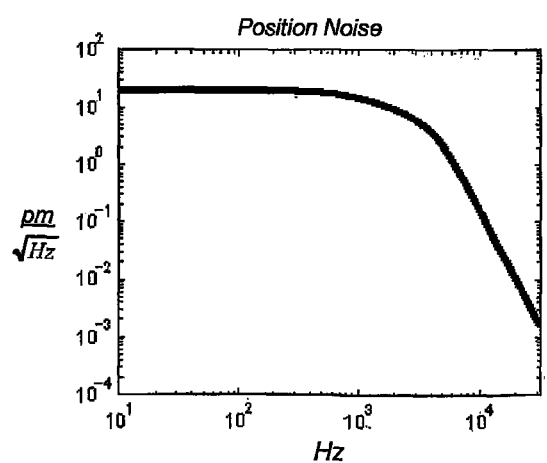

The frequency response of this transfer function is plotted in FIG. 5b. Compared to the integral controller with the same gain margin (5 dB), the bandwidth has been increased from 60 Hz to 1 kHz. Although this is an excellent improvement over the basic integral controller, the gain-margin is still sensitive to changes in resonance frequency. In practice, the controller needs to be conservatively designed for stability with the lowest possible resonance frequency. One disadvantage of increasing closed-loop bandwidth is that position noise is increased. This is illustrated by the wider bandwidth power spectral density plotted in FIG. 5c, which is obtained from the density of the additive sensor noises and the noise sensitivity of the feedback loop. Consequently, it is preferable to additionally use force feedback in the tracking controller instead of a displacement feedback. The inventor has also discovered that using the measured load force as a feedback variable confers advantages over existing feedback loops, especially displacement feedback loops where a displacement measurement is used as a feedback variable. Prior to a detailed discussion of these advantages, it is necessary for the theoretical basis for the system 1 and method 10 of the invention to be described in more detail below.

Figure 6A:
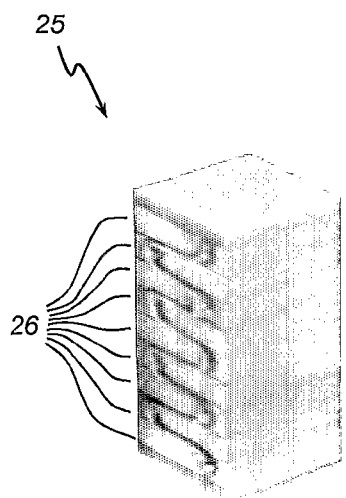
FIG. 6a is a drawing of a Noliac monolithic stack actuator for use in the nanopositioning stage of FIG. 3.
Figure 6B:
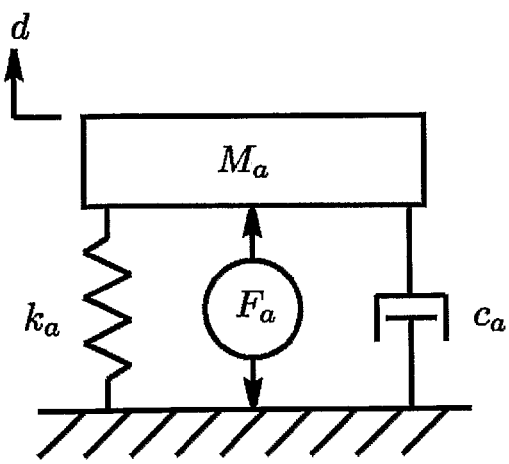
FIG. 6b is a schematic drawing representing the actuator of FIG. 4.

The system 1 and method 10 adequately represents the dominant dynamics exhibited by many nanopositioning geometries. For the purposes of the following discussion, a typical multi-layer monolithic Noliac stack actuator 25 comprising several layers 26 is used to represent the piezoelectric actuator 4, as best illustrated in FIG. 6a. A schematic drawing of a circuit representing the stack actuator 25 is illustrated in FIG. 6b, where the circuit includes the voltage dependent developed force $F_\alpha$, stiffness $k_\alpha$, effective mass $M_\alpha$ and damping coefficient $c_\alpha$.

In the operation of the system 1, the piezoelectric stack actuator 4 experiences an internal stress in response to an applied voltage. The voltage dependent developed force $F_\alpha$ represents this stress and is related to the "free" displacement d of the platform 3 by:

$$\Delta L = \frac{F_a}{k_a} \quad (7)$$

where $\Delta L$ is the change in actuator length (m), and $k_\alpha$ is the actuator stiffness (N/m).

The developed force $F_\alpha$ is most easily related to applied voltage by beginning with the standard expression for unrestrained linear stack actuators, $$\Delta L = d_{33} n V_\alpha, \quad (8)$$

where $d_{33}$ is the piezoelectric strain constant (m/V), n is the number of layers; and $V_\alpha$ is the applied voltage.

Combining equations (7) and (8) yields an expression for the developed force as a function of applied voltage:

$$F_\alpha = d_{33} n k_\alpha V_\alpha \quad (9)$$

That is, the ratio of the developed force $F_\alpha$ to applied voltage $V_\alpha$ is $d_{33} n k_\alpha$ Newtons per Volt, a proportional relationship. In following discussion, this constant will be denoted $g_\alpha$ where $$F_\alpha = g_\alpha V_\alpha \text{ and } g_\alpha = d_{33} n k_\alpha \quad (10)$$

It will be appreciated that the developed force $F_a$ applied to the platform 3 is not the same as the load force on the platform 3 to effect displacement d, as some of the force $F_\alpha$ is dissipated due to the combination of the stiffness and damping effects of the flexures and actuators, and the masses of the platform and actuator.

Although the load force F can be measured in a number of ways, in the embodiment the piezoelectric transducer 5 is used to minimise the additional mass and compliance associated with the force sensor. In particular, piezoelectric transducers advantageously provide high sensitivity and bandwidth with low-noise at high frequencies. In FIG. 3, the transducer 5 takes the form of a single wafer of piezoelectric material interposed or sandwiched between the platform 3 and the actuator 4. On this basis, the amount of generated charge per unit area D (C/m²) is given by the standard strain-charge form of the piezoelectric constituent equations as:

$$D = d_{33} T \quad (11)$$

where $d_{33}$ is the piezoelectric strain constant (m/V), and T is the stress upon the transducer 5.

The generated charge is then $$q = d_{33} F \quad (12)$$

Where the piezoelectric transducer 5 has n layers, the generated charge is $$q = n d_{33} F \quad (13)$$

Figure 7:
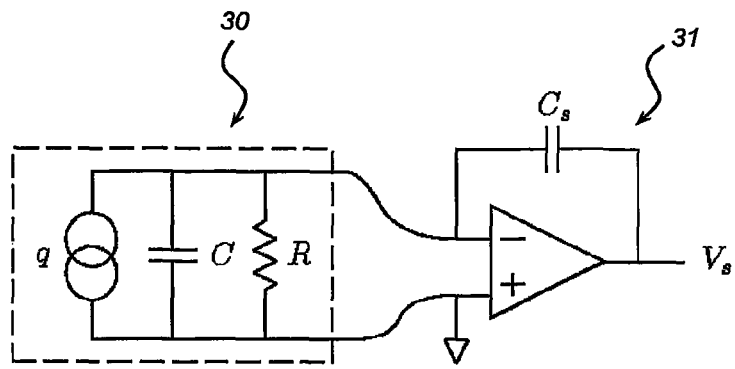
FIG. 7 is a schematic drawing of an electrical model of a force sensor and associated charge measurement circuit for use in the system of FIG. 3.

An electrical model of a piezoelectric force sensor 30 and charge measurement circuit 31 is shown FIG. 7. In this circuit, the output voltage $V_s$ is equal to:

$$V_s = -\frac{q}{C_S} = -\frac{n d_{33} F}{C_s} \quad (14)$$

where $V_s$ is the output voltage of the circuit;
q is the charge;
$C_s$ is the output capacitance of the circuit;
n is the number of layers of the actuator;
$d_{33}$ is the piezoelectric stain constant (m/V); and
F is the load force.

Thus, the scaling between load force F and the output voltage $V_s$ is $$-\frac{n d_{33}}{C_s}$$

Volts per Newton. That is, the load force F is directly proportional to the output voltage of the transducer 5.

Piezoelectric force sensors can also be calibrated using voltage rather than charge measurement. In this case, the generated charge is deposited on the internal capacitance of the transducer. As the terminal voltage is non-zero, the dynamics of the force sensor 5 are slightly altered. In effect, the transducer 5 is marginally stiffened. However, as the stiffness of the force sensor 5 is already substantially greater than the stiffness of the actuator 4 and the flexures 6, this effect is negligible. Therefore, the open-circuit voltage of the piezoelectric force sensor is approximately:

$$V_s = \frac{n d_{33} F}{C} \quad (15)$$

where $V_s$ is the output or measured voltage,
n is the number of layers of the piezoelectric force sensor;
$d_{33}$ is the piezoelectric stain constant (m/V);
F is the load force; and
C is the transducer capacitance.

Therefore, the scaling factor between the load force F and the measured (output) voltage $V_s$ is $$\frac{n d_{33}}{C_s}$$

Volts per Newton. Thus, the load force F can be calculated directly from the output voltage $V_s$ from the force sensing transducer 5. That is, the transducer 5 senses the load force F upon the platform 3 (due to the action of the actuator 4) and converts the load force F into an output voltage $V_s$. The transducer 5 transmits this output voltage $V_s$ as a signal through the connection line 8 to the controller 6, which then processes the output voltage signal in the feedback loop to control the position of the platform 3 and/or damp at least one resonant frequency of the stage 1, in this case the first resonance mode.

The above proportional relationship enables the load force F to be readily measured in the system 1, thus providing a convenient and suitable feedback variable to control the position of the platform 3 and/or damp the resonant frequencies of the system 1. In following discussion, this constant will be denoted as $g_s$ so that:

$$V_s = g_s F \text{ and } g_s = \frac{nd_{33}}{C} \quad (16)$$

The relationship between the developed actuator force $F_\alpha$ and the resultant load force F applied to the platform 3 will now be described.

Figure 8:
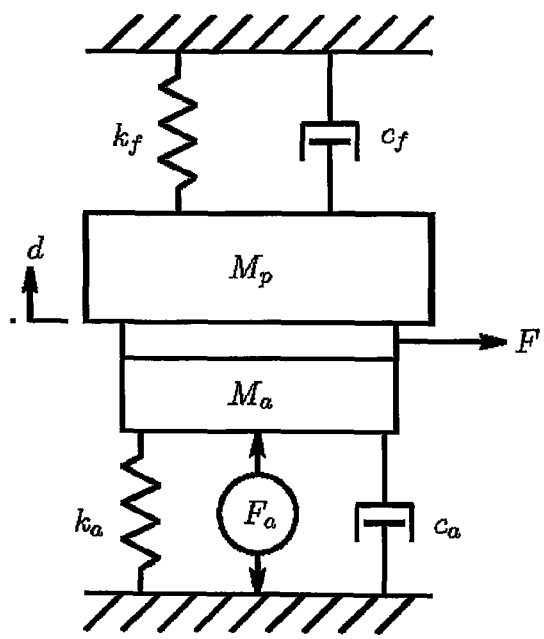
FIG. 8 is a schematic drawing of a mechanical circuit representing the system of FIG. 3.

A schematic mechanical diagram of the single axis nanopositioning system 1 of FIG. 3 is shown in FIG. 8. The developed actuator force $F_\alpha$ results in a load force F and a platform displacement d. The stiffness and damping coefficients of the actuator and the flexures 6 are denoted $k_\alpha$, $c_\alpha$, and $k_f$, $c_f$, respectively. Accordingly, Newton's second law governs the dynamics of the suspended platform 3, as follows:

$$(M_\alpha+M_p)\ddot{d}=F_\alpha-k_\alpha d-k_f d-c_\alpha \dot{d}-c_f \dot{d} \quad (17)$$

where $M_\alpha$, is the effective mass of the actuator 4;

$M_p$ is the effective mass of the platform 3;

d is the displacement of the platform 3;

$F_\alpha$ is the generated actuator force;

$k_\alpha$ is the stiffness of the actuator 4;

$c_\alpha$ is the damping coefficient of the actuator 4;

$k_f$ is the stiffness of the flexures 6;

$c_f$ is the damping coefficient of the flexures 6;

$\dot{d}$ is the first order derivative; and $\ddot{d}$ is the second order derivative.

As the actuator 4 and the flexures 6 are mechanically in parallel with the suspended platform 3, the masses, stiffness and damping coefficients can be grouped together, as follows:

$$M=M_\alpha+M_p, \quad (18)$$

$$k=k_\alpha+k_f \text{ and} \quad (19)$$

$$c=c_\alpha+c_f. \quad (20)$$

The equation of motion is then $$M\ddot{d}+kd+c\dot{d}=F_\alpha, \quad (21)$$

and the transfer function from actuator force $F_a$ to platform displacement d is:

$$\frac{d}{F_a} = \frac{1}{Ms^2+cs+k}. \quad (21)$$

Including the actuator gain $g_\alpha$, the transfer function from applied voltage to displacement can be written as:

$$G_{dVa} = \frac{d}{V_a} = \frac{g_a}{Ms^2+cs+k} \quad (23)$$

The load force F is of interest, and this can be related to the actuator generated force $F_\alpha$ by applying Newton's second law to the actuator mass, as follows:

$$M_\alpha \ddot{d}=F_\alpha-k_\alpha d-c_\alpha \dot{d}-F. \quad (24)$$

This results in the following transfer function between the applied force $F_\alpha$ and measured force F, as follows:

$$\frac{F}{F_a} = 1 - (M_a s^2 + c_a s + k_a)\frac{d}{F_a} \quad (25)$$

$$= \frac{M_p s^2 + c_f s + k_f}{Ms^2 + cs + k} \quad (26)$$

The transfer function in equation (25) can be rewritten as:

$$\frac{F}{F_a} = \frac{M_p}{M} \frac{s^2 + \frac{c_f}{M_p}s + \frac{k_f}{M_p}}{s^2 + \frac{c}{M}s + \frac{k}{M}} \quad (27)$$

This transfer function consists of two pairs of resonant poles and zeros at frequencies $\omega_z$ and $\omega_p$, $$\text{where } \omega_Z = \sqrt{\frac{k_f}{M_p}} \text{ and } \omega_p = \sqrt{\frac{k}{M}} = \sqrt{\frac{k_a + k_f}{M_a + M_p}} \quad (28)$$

In general, the resonance frequency of the zeros will appear below the poles. The condition for this to occur is:

$$\omega_z < \omega_p \quad (29)$$

$$\frac{k_f}{M_p} < \frac{k_a + k_f}{M_a + M_p}$$

$$M_a k_f < k_a M_P.$$

Figure 9:
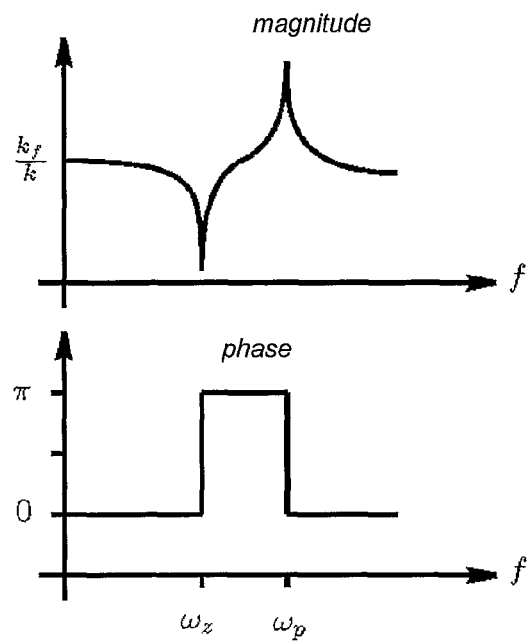
FIG. 9 are frequency response graphs of the force transfer function for the system of FIG. 3.

As the actuator mass $M_\alpha$ and flexural stiffness $k_f$ are significantly lower than the actuator stiffness $k_\alpha$ and platform mass $M_p$, the resonant zeros will always occur below the resonance frequency of the poles. This characteristic is shown in the magnitude and phase frequency response graphs for $F/F_\alpha$ illustrated in FIG. 9.

Figure 10:
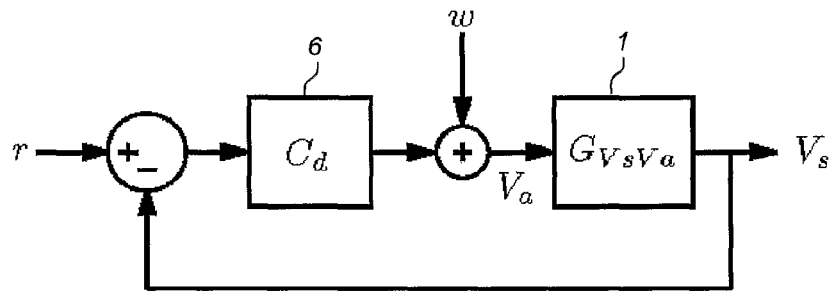
FIG. 10 is a schematic drawing of a circuit representing a nanopositioning system in accordance with another embodiment of the invention.

An example of the system 1 of FIG. 3 will now be described in more detail and is schematically represented in FIG. 10. In the example, the actuator 4 is a 10 mm long PZT (lead zirconium titanate) linear actuator with 200 layers. The force sensing piezoelectric transducer 5 is a single PZT wafer of the same area. The dimensions and physical properties of the system are listed in Table 1 below.

TABLE 1

Example System Parameters

| Parameter | Symbol | Value | |
|---|---|---|---|
| Platform mass | $M_p$ | 100 | g |
| Actuator Mass | $M_a$ | 2 | g |
| Actuator Area | A | 5 × 5 | mm |
| Actuator Length | L | 10 | mm |
| Young's Modulus | $c^E$ | 50 | GPa |
| Charge Constant | $d_{33}$ | 300 × 10$^{-12}$ | C/N |
| Actuator Stiffness | $k_a$ | 125 | N/μm |
| Flexure Stiffness | $k_f$ | 50 | N/μm |
| Actuator Layers | n | 200 | |
| Actuator Damping | $c_a$ | 100 | N/ms$^{-1}$ |
| Flexure Damping | $c_f$ | 100 | N/ms$^{-1}$ |

From these values, the actuator and sensor gains are $$g_\alpha = 7.5 \text{ N/V and } g_s = 0.19 \text{ V/N} \tag{30}$$

which results in an open-loop displacement sensitivity of $$\text{Open-loop sensitivity} = \frac{g_a}{k} = 43 \text{ nm/V}. \tag{31}$$

The full scale displacement is therefore 8.5 μm at 200 V and the system resonance frequencies are $$\omega_p = 6.3 \text{ kHz and } \omega_z = 3.6 \text{ kHz}. \tag{32}$$

In the example, the measured load force is also used to damp the resonance frequencies of the nanopositioning system 1 by processing it in the feedback loop with an integral controller, which will be referred to hereinafter as integral force feedback (IFF). IFF is particularly useful to augment the damping of flexible structures, since it is simple to implement and, under common circumstances, provides excellent damping performance with guaranteed stability.

An IFF damping controller $C_d$ is shown in FIG. 10 connected to the system $G_{V_s V_\alpha}$, which represents the nanopositioning system 1 having respective actuator and sensor gains $g_\alpha$ and $g_s$. Therefore:

$$G_{V_s V_a}(s) = g_a \frac{F(s)}{F_a(s)} g_s \tag{33}$$

$$G_{V_s V_a}(s) = g_a g_s \frac{M_p s^2 + c_f s + k_f}{M s^2 + c s + k}. \tag{34}$$

where $G_{V_s V_\alpha}(s)$ is the system $G_{V_s V_\alpha}$;
$g_\alpha$ is the actuator gain;
$g_s$ is the sensor gain;
F(s) is the load force;
$F_\alpha(s)$ is the force applied by the actuator 4;
$M_p$ is the effective mass of the platform 3;
M is the sum of the effective masses of the platform 3 and the actuator 4;
$c_f$ is the damping coefficient of the flexures 6;
c is the sum of the damping coefficients of the flexures 6 and the actuator 4;
$k_f$ is the stiffness of the flexures 6;
k is the sum of the stiffnesses of the flexures 6 and the actuator 4; and
s is the Laplace transform parameter.

By including the actuator and sensor gains $g_\alpha$ and $g_s$, the system transfer function from the applied voltage to measured voltage $G_{V_s V_\alpha}$ can be derived as, $$G_{V_s V_a} = \frac{V_s}{V_a} = g_a g_s \frac{M_p s^2 + c_f s + k_f}{M s^2 + c s + k} \tag{35}$$

The two system transfer functions $G_{dV_\alpha}$ and $G_{V_s V_\alpha}$ can be used to simulate the performance of feedback control systems. As both of these transfer functions have the same input $V_\alpha$ and poles, it is convenient to define a single-input two-output system G that contains both of these transfer functions, $$G = \begin{bmatrix} G_{dV_a} \\ G_{V_s V_a} \end{bmatrix} \tag{36}$$

In the system $G_{V_s V_\alpha}$, the phase response lies between 0 and 180 degrees. This is a general feature of flexible structures with input and outputs proportional to applied and measured force. A unique property of such systems is that integral control can be directly applied; ie.

$$C_d(s) = \frac{\alpha}{s} \tag{37}$$

where $C_d(s)$ is the integral controller;
α is the controller gain; and
s is the Laplace transform parameter.

As the integral controller $C_d$ has a constant phase lag of 90 degrees, the loop-gain phase lies between −90 and 90 degrees. That is, the closed-loop system has an infinite gain-margin and phase-margin of 90 degrees. As a consequence, the system $G_{V_s V_\alpha}$ has the advantageous properties of simplicity and robustness due to the use of IFF.

One solution for the optimal feedback gain α makes two valid assumptions; firstly, that the system damping coefficients are small and can be neglected. Secondly, that the actuator mass $M_\alpha$ is negligible compared to the platform mass $M_p$. With these assumptions, the optimal feedback gain α* and corresponding maximum closed-loop damping ratio ξ* are:

$$\alpha^* = \frac{\omega_p \sqrt{\omega_p \omega_z}}{g_s g_a} \tag{38}$$

$$\xi^* = \frac{\omega_p - \omega_z}{2\omega_z} \tag{39}$$

The closed-loop poles are obtained from the roots of the following equation:

$$1 + \alpha g_s g_a \frac{s^2 + \omega_z^2}{s(s^2 + \omega_p^2)} = 0. \tag{40}$$

Figure 11:
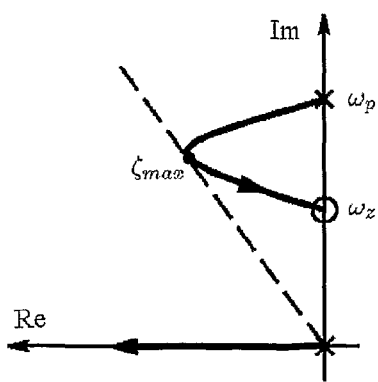
FIG. 11 is a root-locus of the closed-loop poles for the integral controller C from FIG. 10.

The corresponding closed-loop root-locus is plotted in FIG. 11, where it can be seen that the closed-loop poles remain in the left half plane, meaning that the system is unconditionally stable. The root-locus also provides a simple and convenient method for finding the optimal feedback gain numerically. This is useful where the model parameters are unknown, for example, if the system $G_{V_s V_\alpha}$ is procured directly from experimental data by system identification.

For the example system described above, the optimal gain and maximum damping ratio are computed respectively from equations (38) and (39) as:

$$\alpha^* = 4.0 \times 10^4 \text{ and } \xi^* = 0.43. \tag{41}$$

These values can be checked with a numerical root-locus plot. The numerically optimal gain is $4.07 \times 10^4$ which provides a closed-loop damping ratio of 0.45. This correlates closely with the predicted values of equation (41) and supports the accuracy of the assumptions made in deriving the optimal gain.

Figure 12:
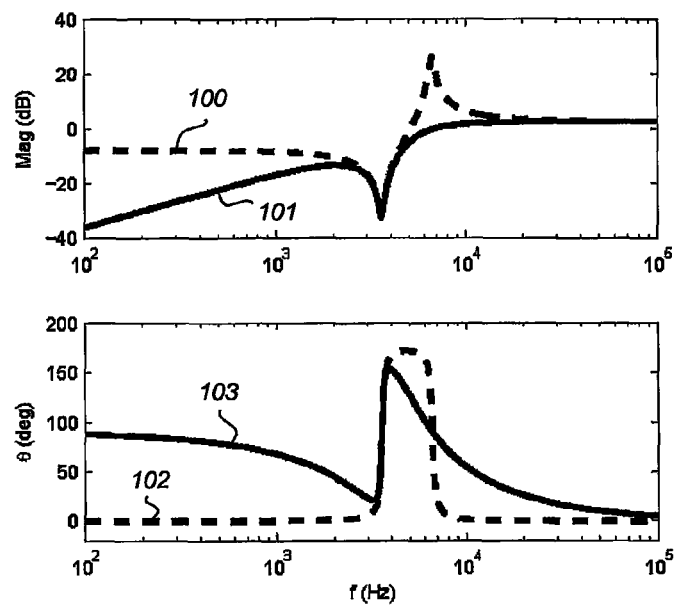
FIG. 12 are frequency response graphs comparing the open-loop and closed-loop frequency responses of the system of FIG. 9.

The simulated open-loop and closed-loop frequency responses from the disturbance input w to the measured sensor voltage $V_s$ in the system 1 employing IFF in accordance with the embodiment of FIG. 10 are plotted in the frequency response graphs of FIG. 12. In the magnitude graph, the open-loop frequency response is plotted as line 100 while the closed-loop response is plotted as line 101. In the phase graph, the open-loop frequency response is plotted as line 102 while the closed-loop response is plotted as line 103. A comparison of the open-loop lines 100 and 102 with the closed-loop line 101 and 103, respectively, shows that the integral controller $C_d$ significantly improves system damping and disturbance rejection at low frequencies where IFF is used in accordance with the embodiment of the invention. That is, using the measured load force as a feedback variable improves the damping of the system 1.

The relationship between the measured load force and the displacement d that is used by the controller 6 in the feedback loop to control the position of the platform 3 will now be derived. This may be done by either applying Newton's second law to the platform mass $M_p$ or by multiplying the two system transfer functions (24) and (26); ie.

$$\frac{d}{F} = \frac{d}{F_a}\left(\frac{F}{F_a}\right)^{-1} \quad (42)$$

$$\frac{d}{F} = \frac{1}{M_P s^2 + c_f s + k_f}. \quad (43)$$

Thus, the measured voltage $V_s$ is related to displacement by $$\frac{d}{V_s} = \frac{d}{g_s F} = \frac{1/g_s}{M_P s^2 + c_f s + k_f} \quad (44)$$

Thus, the controller 6 uses the relationship in equation (44) in the feedback loop to calculate the displacement d of the platform 3 from the measured output voltage $V_s$ from the transducer 5 in the system 1.

From the transfer function $d/V_s$ in equation (44) it can be observed that displacement is proportional to force up until the frequency of the system zeros, $$\omega_z = \sqrt{\frac{k_f}{M_p}}.$$

The scaling factor is $g_{cl}=1/g_s k_f$ meters per Volt. That is, $$d \approx g_{cl} V_s = \frac{1}{g_s k_f} V_s \text{ for } \omega < \omega_z \quad (45)$$

As $V_s$ is directly proportional to displacement at frequencies below $\omega_z$, it follows that the measured force is also proportional to the displacement at frequencies below the system zeros.

In conclusion, the measured load force F, via its output voltage $V_s$ can be used to calculate the displacement d above or below the response frequency $\omega_z$. Thus, the measured load force provides a suitable feedback variable for the controller 6 when positional or trajectory tracking is required within the system.

While logical progression of this proportional relationship would be to simply apply a reference input r to the force feedback loop and expect displacement tracking at frequencies from DC to $\omega_z$, the inventor has discovered that it is difficult to obtain accurate displacement tracking due to the high-pass filter formed by the piezoelectric capacitance and finite input impedance of charge amplifiers and voltage buffers. The measured voltage across a piezoelectric force sensor is equal to $$V_s = V_p \frac{s}{s + 1/R_{in} C} \quad (46)$$

where $V_p$ is the piezoelectric strain voltage, $R_{in}$ is the voltage buffer input impedance; and C is the transducer capacitance.

In equation (46), the filter is high-pass with a cut-off frequency of $1/R_{in}C$.

The high-pass cut-off frequency can be made extremely low, in the order of 1 mHz, to ameliorate this problem. However, this is not always desirable as the settling time for the system 1 becomes extremely long. In addition, the system 1 still cannot track DC and the high source impedance results in a noisy measurement due to the buffer input current noise. Therefore, it is preferable to eliminate the cut-off frequency of the piezoelectric sensor by setting a "cross-over" frequency at which the piezoelectric force sensor is not used.

Figure 13:
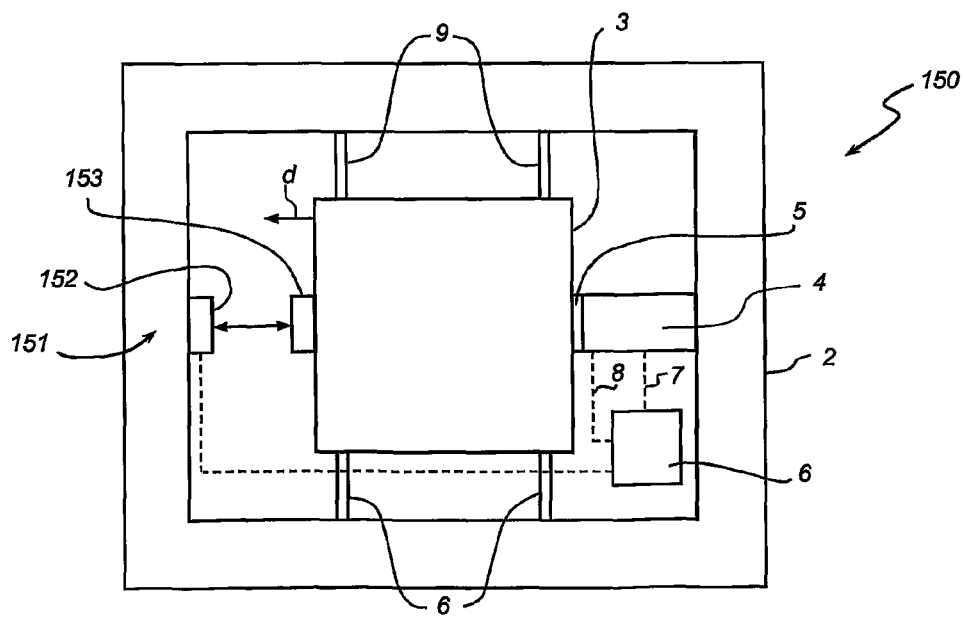
FIG. 13 is a schematic drawing of a single degree of freedom nanopositioning stage in accordance with a further embodiment of the invention.
Figure 14A:
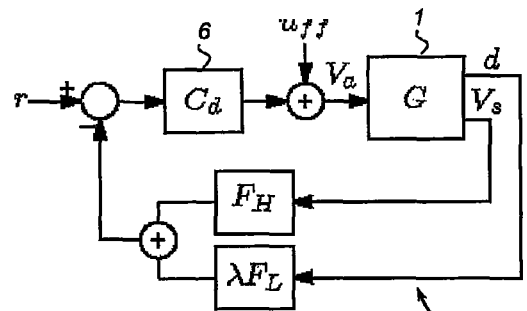
FIG. 14a is a schematic drawing of a circuit representing the nanopositioning system of FIG. 13.

Instead of the measured load force, the inventor proposes to use an auxiliary signal, either an estimate of the actual displacement or a displacement measurement to correct the response at low frequencies. To provide an auxiliary signal, the system 1 is modified to incorporate a dual sensor control loop in another embodiment of the invention, as illustrated in FIGS. 13 to 15, where corresponding features have been given the same reference numerals.

This embodiment differs from the embodiment of FIG. 3 in that the nanopositioning stage 150 has a position or displacement sensor in the form of an optical sensor 151 for measuring the position or displacement of the platform 3 when displaced by the actuator 4. The optical sensor 151 includes two sensor elements 152 and 153 respectively mounted to the fixed base 2 and the platform 3. The optical sensor 151 is electrically connected to the controller 6 via a connection line 154. The displacement signals obtained from the optical sensor 151 are transmitted to the controller 6 via a connection line 154 for processing in the feedback loop. In effect, the nanopositioning stage 150 has a dual sensor feedback loop, comprising the force sensing piezoelectric transducer 5 and the optical displacement sensor 151. Also, the optical displacement sensor may be replaced with a capacitive or inductive proximity sensor, if desired.

The tracking control loop is schematically illustrated in FIG. 14, where corresponding features have been given the same reference letters. The loop 160 is similar to FIG. 8 with the exception of the additional complementary filters $F_H$ and $F_L$. These complementary filters $F_H$ and $F_L$ substitute the displacement measurement $d_m$ for the measured load force output voltage $V_s$ at frequencies below the cross-over frequency $\omega_c$, which as discussed above is the frequency, preferably above the cut-off frequency, at which the piezoelectric sensor is deemed to be unreliable due to noise. The simplest choices of complementary filters are:

$$F_H = \frac{s}{s+\omega_c} \text{ and } F_L = \frac{\omega_c}{s+\omega_c} \quad (47)$$

The cross-over frequency $\omega_c$ is equal to the bandwidth of the filters $F_H$ and $F_L$.

As the measured displacement signal d will have a different sensitivity than $V_s$, it must be scaled by an equalising constant $\lambda$, as shown in FIG. 14. The value of $\lambda$ should be $$\lambda = \frac{G_{V_sV_a}(0)}{G_{dV_a}(0)} \quad (48)$$

If $\lambda$ is chosen correctly, the closed-loop response $\widetilde{G_{dr}}$ is $$\widetilde{G_{dr}} = \frac{G_{dV_a}C_d}{1+C_dG_{V_sV_a}} \quad (49)$$

As this control loop is unconditionally stable, there is no restriction on the gain of $C_d$. However, as $C_d$ was chosen in the embodiment of FIG. 5 to provide optimal damping performance, this value should be retained. It is believed that further increases in $C_d$ are not productive as the disturbance rejection at the resonance frequency will degrade.

Figure 14B:
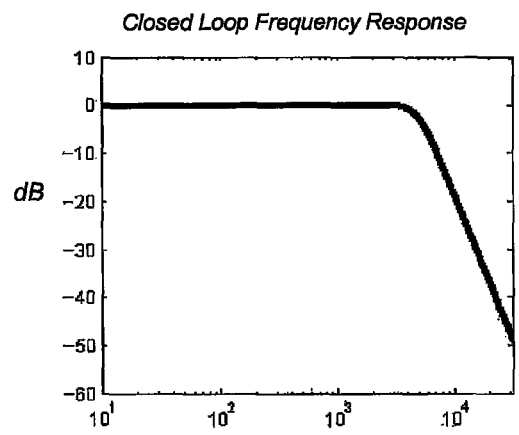
Figure 14C:
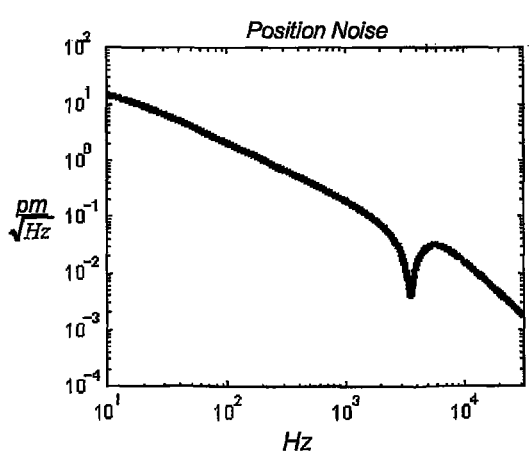
Figure 15:
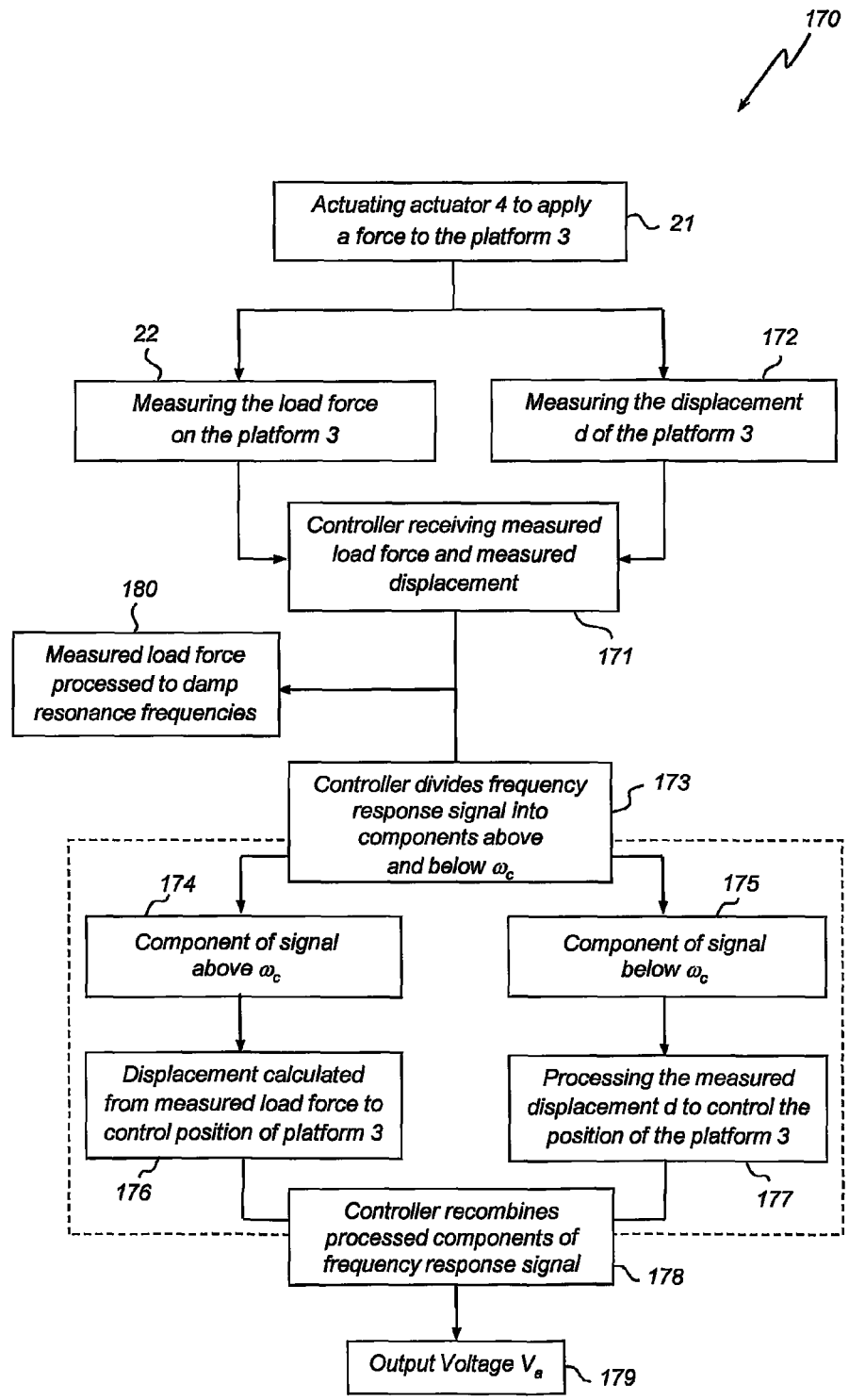
FIG. 15 is a schematic drawing of a method in accordance with another embodiment of the invention for implementation in the system of FIG. 13.

The closed-loop frequency response of this dual sensor control loop is plotted in FIG. 14b. The higher gain increases the bandwidth from 1 kHz to 5.1 kHz, compared to the embodiment of FIG. 5, which is using the measured load force to suppress the resonance frequencies of the system. This increase is derived from the theoretical infinite gain margin and 90° phase margin, both of which are immune to variations in the resonance frequency. The position noise is also plotted in FIG. 14c, which shows a significant improvement in noise performance.

Although displacement sensors are typically noisy over large bandwidths, they have better thermal and drift characteristics than piezoelectric sensors. In effect, the complementary filters $F_H$ and $F_L$ exploit the best aspects of each signal. The wide-bandwidth and low noise of piezoelectric force sensors is exploited at frequencies above the cross-over frequency $\omega_c$, while the displacement sensors provide a high level of stability at DC and at low frequencies below the cross-over frequency $\omega_c$.

The operation of the nanopositioning stage 150 will now be described with reference to FIGS. 13 and 15, where FIG. 15 illustrates the method 170 according to another embodiment of the invention and in which corresponding features have been given the same reference numerals. The nanopositioning stage 150 functions in a similar manner as the embodiment of FIG. 3. That is, an input signal corresponding to a desired position of the object on the platform 3 is sent to the controller 6, which converts it into a signal corresponding to the necessary displacement $d_1$. The controller 6 then actuates the piezoelectric actuator 4 through the connection line 7 with the displacement signal. The actuator 4 then applies a force to the platform 3 to displace it a distance d at step 21. The piezoelectric transducer 5 measures the load force on the platform 3 at step 22, converts the load force F into an output voltage $V_s$ and then transmits this output voltage $V_s$ as a signal corresponding to the measured load force back to the controller 6 through the connection line 8 at step 171.

However, at the same time, the optical displacement sensor 151 measures the displacement d at step 172 using optical sensing elements 152 and 153, converts it into a signal corresponding to the measured displacement d and transmits it back to the controller 6 through the connection line 154 at step 171.

The controller 6 divides the signal representing the response frequency $\omega_1$ at step 173 into components above and below the cross-over frequency $\omega_c$, designated as items 174 and 175, respectively. The component 174 above $\omega_c$ is processed by feeding the measured load force signal into the feedback loop and calculating the actual displacement $d_2$ in accordance with the predetermined proportional relationship of equation (43), as best shown in step 176, as best shown in FIG. 14a. At the same time, the component 175 below the cross-over frequency $\omega_c$ is processed by feeding the measured displacement d into the feedback loop as a substitute for the measured load force at step 177. This is schematically illustrated in FIG. 15a.

After processing the components 174 and 175, the components are then recombined at step 178 to produce the output voltage signal $V_\alpha$ from the controller 6 at step 179 that is to be applied to the piezoelectric actuator 4.

If there is a variation in the actual displacement $d_2$ or measured displacement d to the desired displacement $d_1$; that is, $d_1 \neq d_2$ or $d_1 \neq d$, then the controller 6 applies the output voltage signal $V_\alpha$ through the connection line 7 to the piezoelectric actuator 4 to decrease or increase the force applied to the platform 3, and hence the load force on the platform, thus adjusting the position of the platform 3. Thus, the stage 1 is able to advantageously dynamically correct the platform position without being adversely affected by sensor-induced noise. This is because at frequencies above the cross-over frequency $\omega_c$, the piezoelectric transducer 5 has a wider bandwidth and generates much less noise than standard position sensors, such as inductive and capacitive position sensors. At DC and low frequencies below the cross-over frequency $\omega_c$, the displacement sensor 151 provides a high level of stability and has better thermal and drift characteristics than piezoelectric sensors. In effect, the system 150 and method 170 exploit the best aspects of each signal.

Alternatively, or in addition, to the position adjustment, at step 180 the controller 6 processes the measured load force in the feedback loop to increase the damping ratio $\xi$ for the stage 150. As discussed above, this proportionately increases the feedback gain and the closed-loop bandwidth. Thus, the stage 150 is able to operate in a larger closed-loop bandwidth while meeting the condition for closed-loop stability in accordance with equation (2).

Figure 16A:
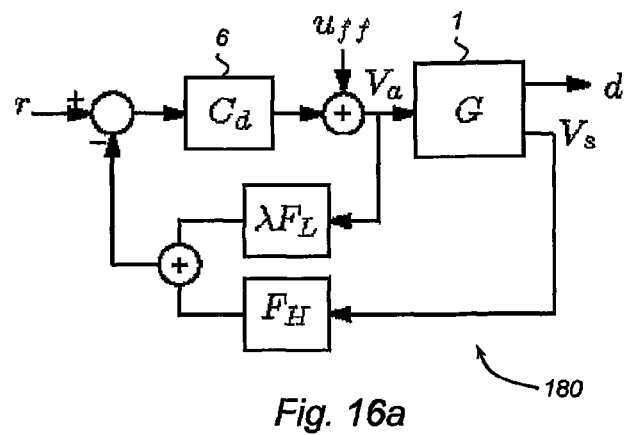
FIG. 16a is a schematic drawing of a circuit representing a nanopositioning system according to another embodiment of the invention.

While the displacement signal d is obtained by using a physical displacement sensor 150, the displacement signal d can instead be derived by an estimate calculated from the input voltage $V_\alpha$ and the open-loop response of the system. This may be suitable where a physical displacement sensor is not available or the system does not require a high level of accuracy at DC. A further embodiment is illustrated in FIG. 16, which the inventor has called a low frequency bypass employing an estimated displacement signal described above, and where corresponding features have been given the same reference numerals. As best shown in FIG. 16a, the loop 180 is similar to the loop 160 of FIG. 14a, with the exception that the complementary filters $F_H$ and $F_L$ substitute an estimated displacement d for the measured load force output voltage $V_s$ at frequencies below the cross-over frequency $\omega_c$. That is, in the embodiment of FIG. 16, the measured load force is still used for tracking control for frequencies above the cross-over frequency $\omega_c$ and/or damping control, as in FIG. 14, but no displacement measurement or sensor is used. The signal $V_\alpha$ requires the same sensitivity as $V_s$, so the scaling constant $\lambda$ is $$\lambda = G_{V_s V_\alpha}(0) \quad (50)$$

Figure 16B:
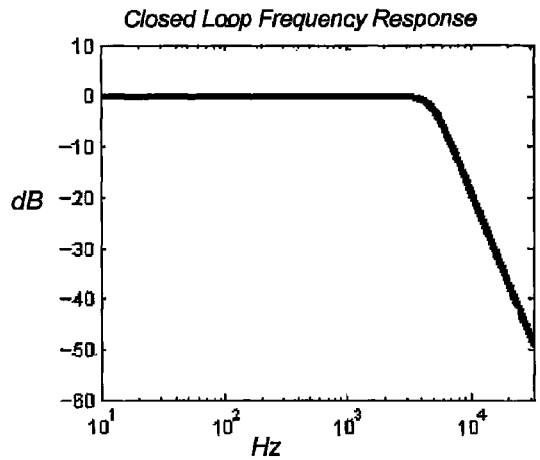
Figure 16C:
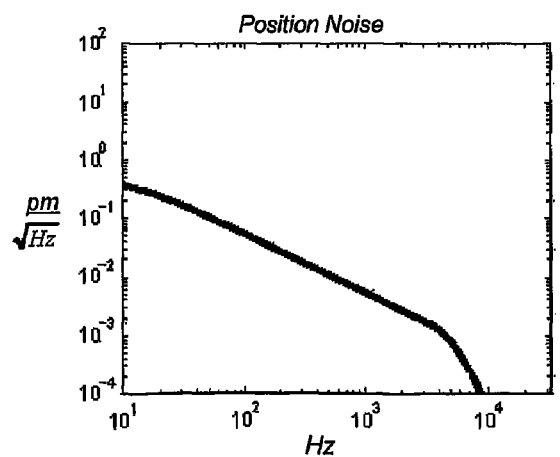

If $\lambda$ is chosen correctly, the closed-loop response and stability characteristics are the same as that discussed above, as best shown by the closed-loop frequency response graph of FIG. 16b. The foremost benefit from eliminating the physical displacement sensor is noise reduction. The closed-loop position noise density, plotted in FIG. 16c, is now $$\hat{N}_a(\omega) = \left| \frac{-G_{dVa} C_t C_d}{1 + G_{dVa} C_t C_d + C_d G_{VsVa}} \right| N_d(\omega) \quad (51)$$

which are orders of magnitude below the other controllers. The force feedback technique with low frequency bypass opens the possibility for nanopositioning systems with large range, wide bandwidth and subatomic resolution. These characteristics are demonstrated experimentally in the examples below. The major penalty from eliminating the physical displacement sensor is that linearity is now dependent only on the piezoelectric force sensor and flexural spring constant $k_f$, which is less reliable. There is also no control of creep. Although these drawbacks may preclude the use of this technique in some applications, other applications requiring subatomic resolution with wide bandwidth will benefit greatly, for example, video speed scanning probe microscopy.

The closed loop response for both the control loops in FIGS. 14a and 16a is $$\tilde{G}_{d_r}^- = \frac{G_{dVa} C_d}{1 + C_d G_{VsVa}} \quad (52)$$

A feedforward input $u_{ff}$ can be optionally used to improve the closed-loop response of the system, as best shown in FIGS. 14a and 16a. Inversion based feedforward provides the best performance but the additional complexity is undesirable for analog implementation. Accordingly, a basic but effective form of feedforward compensation is to simply use the inverse DC gain of the system as a feedforward injection filter, i.e.

$$u_{ff} = k_{ff} r \quad (53)$$

This is easily implemented and can provide a reduction in tracking lag.

With a feedforward input, the closed-loop transfer function of the dual-sensor and low-frequency bypass controller is $$\tilde{G}_{d_r}^- = \frac{k_{ff} G_{dVa} + G_{dVa} C_d}{1 + C_d G_{VsVa}} \quad (54)$$

To evaluate the performance of the integral controller C in accordance with the embodiments of FIGS. 13 to 16, they were compared to a basic integral tracking controller with a displacement feedback loop and the direct tracking controller C with an internal force feedback loop for damping control, as best shown in FIG. 5a. In this comparison, the integral controller C was tuned to provide the best possible performance with no regard for stability margins. The controller C also has the same feedback gains as derived and discussed above. The low-frequency drift introduced by the sensor capacitance and buffer input impedance is eliminated using complementary filters designed with a cut-off frequency of 1 Hz. The signal d is derived from the open-loop sensitivity of the positioning platform 3.

Figure 17:
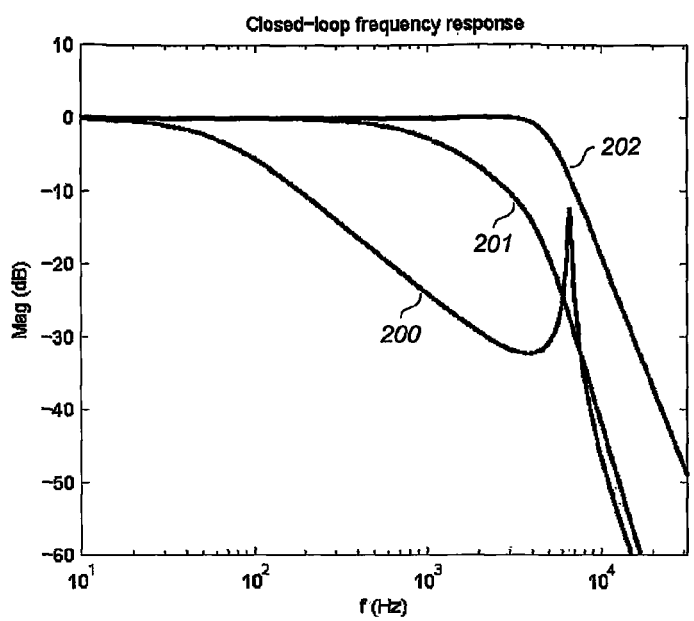
FIGS. 17 and 18 are frequency response graphs comparing the performance of the embodiments of FIGS. 5 and 13 to 16 with a basic integral controller.

The closed-loop frequency responses of the three controllers were plotted, as shown in FIG. 17. In the magnitude frequency response graph, the line 200 is the frequency response of the basic controller, the line 201 is the frequency response of the direct tracking controller and line 202 is the controller C with IFF (using a dual sensor loop or a low frequency bypass). As discussed above, if $\lambda$ is chosen correctly, the closed-loop response and stability characteristics of the low frequency bypass and the dual sensor loop are the same. The magnitude response graph indicates that the controllers employing force feedback (direct tracking or IFF) in accordance with the embodiments of FIGS. 5 and 13 to 16 provide a bandwidth close to the resonance frequency of the system, which corresponds to the open-loop frequency response, due to the high gain of the feedback loop. Furthermore, when compared with the standard controller (line 200), it can be seen that the controllers employing force feedback provide exceptional performance, especially when considering the large stability margins and controller simplicity.

The bandwidth and stability margins of the three controllers are listed in Table 2 for comparison.

TABLE 2

Bandwidth and Gain Margins for Controllers

| Controller | Bandwidth | Gain Margin |
|---|---|---|
| Basic Integral | 60 Hz | 5 dB |
| Direct Tracking | 1 KHz | 5 dB |
| Dual Sensor | 5.1 kHz | infinite |
| Low-frequency bypass | 5.1 kHz | infinite |

Figure 18:
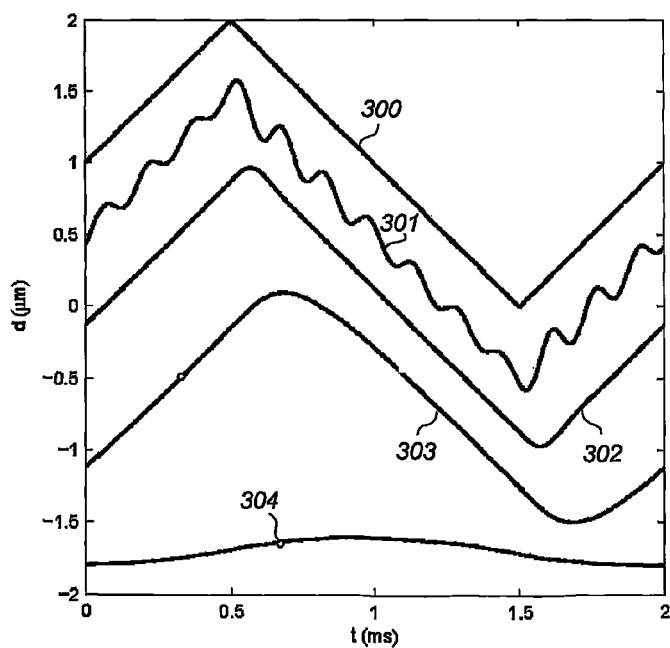

In FIG. 18, the closed-loop frequency response of the basic controller, the direct tracking controller, the integral controller using IFF with a dual sensor or a low frequency bypass are compared using a 500 Hz triangle reference wave, which is illustrated by the line 300. The line 301 is the open-loop response of the system 1 without feedback, the line 302 is the frequency response of the integral controller using IFF with a dual sensor or low-frequency bypass, the line 303 is the frequency response of the direct tracking controller and the line 304 is the frequency response of the basic integral controller. It can be seen from the graph that the frequency of operation is beyond the capacity of the basic integral controller, as indicated by line 304. However, the controller implementing IFF with a dual sensor or low-frequency bypass (line 302) provides sufficient bandwidth to achieve good tracking performance, even with an input frequency only 1 decade below the system resonance, as shown by the relatively close proximity of the line 302 to the reference line 300 and the open-loop line 301. The direct tracking controller using the measured load force for damping control (line 303) still provided adequate bandwidth for improved tracking performance, but had greater tracking lag.

Therefore, the examples using the embodiment of the invention incorporating a dual sensor feedback loop using force and displacement as the feedback variables demonstrate the effectiveness of the proposed tracking and damping controller implementing the method and system of the invention. Advantageously, this embodiment overcomes the high-pass characteristic exhibited by piezoelectric sensors at low frequencies by replacing the low frequency force signal with a displacement measurement or displacement signal estimated from the open-loop system dynamics. In particular, the dual sensor/low frequency bypass integral force feedback controller in this embodiment of the invention provides a closed-loop bandwidth approaching the open-loop resonance frequency while maintaining an infinite gain margin and 90° phase margin. By comparison, a basic integral displacement feedback controller achieves only 1% of the bandwidth with a gain-margin of only 5 dB.

Figure 19A:
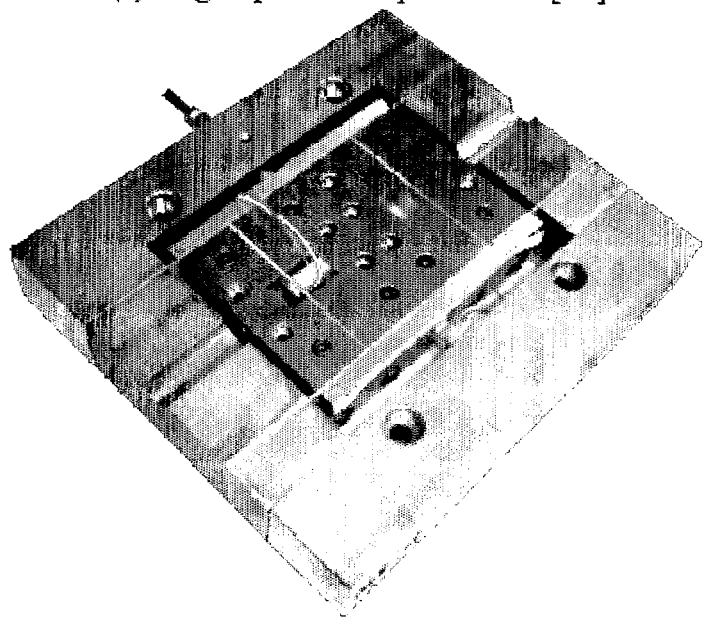
FIGS. 19a, 19b and 19c are drawings of a nanopositioning platform and two types of associated force sensor, respectively, in accordance with an example of the invention.

An example in accordance with the embodiments of the invention will now be described with reference to FIGS. 19 and 20. The dual sensor loop configuration of FIG. 15 was applied to a high-bandwidth lateral nanopositioning platform designed for video speed scanning probe microscopy, as best shown in FIG. 19a. This device is a serial kinematic device with two moving stages both suspended by leaf flexures and driven directly by 10 mm stack actuators. A small stage is located in the centre and is designed for scan-rates up to 5 kHz so as to be sufficiently fast with a resonance frequency of 29 kHz. A larger stage provides motion in the adjacent axis and is limited by a resonance frequency of 1.5 kHz. As this stage is required to operate with triangular trajectories up to 100 Hz, active control is required. The main application for this nanopositioning platform is high speed scanning probe microscopy, where high resolution and wide bandwidth are the most desirable performance characteristics.

The platform is mechanically similar to the system in FIG. 13. The major difference is the existence of higher frequency modes beyond the first resonance frequency. These can be observed in the open-loop frequency response plotted in FIG. 20a. While only a single mode system has been discussed for simplicity, it will be appreciated that the method and system of the invention is readily applicable to higher order resonance modes. It has been found that IFF is especially suited to resonant systems of high-order. This is due to the large feedthrough term in equation (25), which guarantees zero-pole ordering regardless of system order. Hence, the excellent stability characteristics are not affected by the existence of higher-order resonance modes.

Figure 19B:
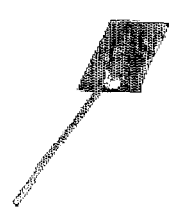
Figure 19C:
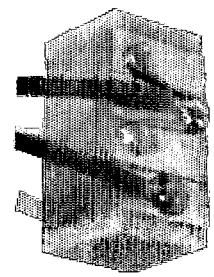

The nanopositioning platform has two sensors installed, an ADE Tech 2804 capacitive sensor and a piezoelectric force sensor. Two types of piezoelectric force sensor were tested, a standard plate sensor, as best shown in FIG. 19b, and a custom stack actuator with an integrated force sensor, as best shown in FIG. 19c. The plate sensor is only a single layer of piezoelectric material with metal electrodes on the top and bottom faces. The stack actuator is 5×5×10 mm in dimensions and was manufactured by Noliac A/S, Denmark. This transducer is mechanically stronger than the plate sensor and due its larger capacitance, is less sensitive to current noise. The actuator was driven with a high-voltage amplifier of the inventor's own design.

Figure 20A:
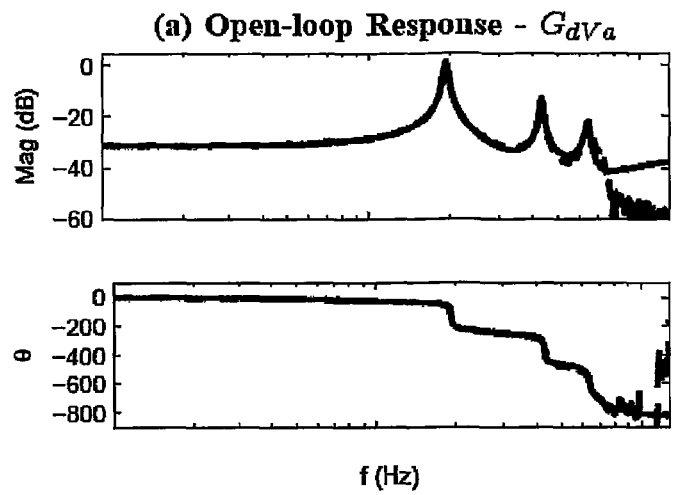
FIGS. 20a and 20b are the open-loop and closed-loop frequency response graphs illustrating the performance of the nanopositioning platform of FIG. 19.

In FIG. 20a the response of a 7th order, single input, two-output identified model was verified to closely match the system response. The optimal control gain was determined to be $\beta=7800$, using the root-locus technique. Together with the 1 Hz corner frequency complementary filters, the controller was implemented with an analog circuit. Due to the simplicity of the control loop, the use of analog implementation is straight-forward and has the benefits of avoiding the quantisation noise, finite resolution and sampling delay associated with digital controllers.

Figure 20B:
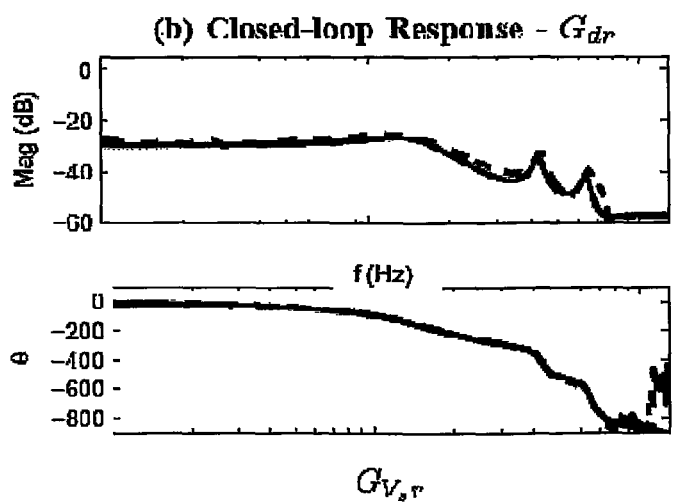

The closed-loop frequency response is plotted in FIG. 20b and reveals significant damping of the first three modes by 24, 9 and 4 dB. In addition to experimental data, the simulated response is also overlain which shows a close correlation. The tracking bandwidth of the closed-loop system is 2.07 kHz, which is higher than the open-loop resonance frequency and significantly greater than the bandwidth achievable with a direct tracking controller, predicted to be 210 Hz with a 5 dB gain-margin. Another major benefit associated with the piezoelectric force sensor is its extremely low additive noise.

Thus, the embodiments of the invention add a force sensor into a nanopositioning system to measure the load force applied to the platform and thus enable the controller to use the measured load force to control the position of the platform and/or damp the resonant frequencies of the system. In the case of platform positioning control, the measured load force is used to calculate the platform displacement. This allows a wide bandwidth damping controller to be adapted into an exceptionally high performance tracking controller without sacrificing stability margins. In addition, a piezoelectric sensor can be used as the force sensor, and so generates a lesser amount of sensor-induced noise compared to existing displacement sensors.

In relation to damping control, the resulting transfer function from applied voltage to measured load force exhibits a zero-pole ordering which greatly simplifies the design and implementation of the damping controller, permitting exceptional damping performance to be achieved with a simple integral controller without any limitations on the gain. The system according to the invention is thus stable with a theoretically infinite gain margin and 90 degrees phase margin. Other outstanding characteristics include guaranteed stability and insensitivity to changes in resonance frequency.

In particular, the increased bandwidth and resolution offered by the invention, combined with the simple implementation and high level of robustness, allows nanopositioning systems implementing the invention to be employed in a new range of high-speed applications. For example, due to the performance penalties associated with closed-loop control, high-speed scanning probe microscopes currently use open-loop nanopositioning devices. Due to the simplicity and bandwidth of the invention, such applications can now utilise closed-loop control with the associated benefits of improved linearity, less vibration and rejection of disturbance. In all these respects, the invention represents a practically and commercially significant improvement over the prior art.

Although the invention has been described with reference to specific examples, it will be appreciated by those skilled in the art that the invention may be embodied in many other forms.

The claims defining the invention are as follows:

1. A system for positioning an object, comprising:
    a fixed base;
    a support for the object;
    an actuator for applying a force to displace the support relative to the fixed base;
    a sensor for measuring the load force on the support, and
    a controller for processing the measured load force to control the position of the support and/or damp at least one resonance frequency of the system.

2. The system of claim 1, wherein the controller processes the measured load force in a feedback loop.

3. The system of claim 1, wherein the controller adjusts the position of the support in response to the measured load force.

4. The system of claim 1, wherein the controller controls the actuator to adjust the position of the support.

5. The system of claim 1, wherein the controller calculates the displacement of the support from the measured load force.

6. The system of claim 5, wherein the displacement of the support is calculated by the relationship:

$$\frac{d}{F} = \frac{1}{M_P s^2 + c_f s + k_f}$$

where d is the displacement of the support;
F is the measured load force;
$M_p$ is the mass of the support;
s is the Laplace transform parameter;
$c_f$ is the flexure damping ratio; and
$k_f$ is the flexure stiffness.

7. The system of claim 1, wherein the force sensor generates an output voltage corresponding to the measured load force and the displacement of the support is calculated as a proportion of the output voltage.

8. The system of claim 7, wherein the displacement of the support is calculated by the relationship:

$$\frac{d}{V_s} = \frac{d}{g_s F} = \frac{1/g_s}{M_P s^2 + c_f s + k_f}$$

where d is the displacement of the support;
$V_s$ is the output voltage of the measured load force;
F is the measured load force;
$g_s$ is the force sensor gain;
$M_p$ is the mass of the support;
s is the Laplace transform parameter;
$c_f$ is the flexure damping ratio; and
$k_f$ is the flexure stiffness.

9. The system of claim 1, wherein the force sensor is calibrated using the charge and/or the voltage of the force sensor.

10. The system of claim 2, wherein the controller processes the measured load force in the feedback loop at frequencies above a predetermined cross-over frequency $\omega_c$.

11. The system of claim 10, wherein the cross-over frequency $\omega_c$ is above a cut-off frequency of the force sensor.

12. The system of claim 10, wherein the cross-over frequency $\omega_c$ is determined according to the relationship:

$$\omega_c > \omega_{co} = \frac{1}{R_{in} C}$$

where $\omega_c$ is the cross-over frequency;
$\omega_{co}$ is the cut-off frequency;
$R_{in}$ is the voltage buffer input impedance, and
C is the capacitance of the force sensor.

13. The system of claim 10, further comprising a position sensor for measuring the position of the support, wherein the measured support position is used to calculate the displacement of the support and the controller processes the calculated displacement at frequencies below the cross-over frequency $\omega_c$.

14. The system of claim 10, wherein the controller calculates the displacement of the support from the input voltage of the actuator and the open-loop response of the system, and processes the calculated displacement at frequencies below the cross-over frequency $\omega_c$.

15. The system of claim 10, further comprising a displacement sensor for measuring the displacement of the support, wherein the controller processes the measured displacement in the feedback loop at frequencies below a predetermined cross-over frequency $\omega_c$.

16. The system of claim 2, wherein the controller processes the measured load force in the feedback loop to increase the damping ratio of the system.

17. The system of claim 2, wherein the controller adds a feedforward input to the feedback loop to improve the closed-loop response of the system.

18. The system of claim 1, wherein the at least one resonance frequency is the first resonance mode of the system.

19. The system of claim 1, further comprising multiple resonance modes and wherein the controller damps one or more resonance modes of the system.

20. The system of claim 1, wherein the force sensor is interposed at least partially between the support and the actuator.

21. The system of claim 1, wherein the system is a nanopositioning system.

22. A method of controlling a system for positioning an object, the system comprising a fixed base, a support for the object and an actuator for applying a force to the support, the method comprising the steps of:
  actuating the actuator to apply the force to displace the support relative to the fixed base;
  measuring the load force on the support, and
  processing the measured load force to control the position of the support and/or damp at least one resonance frequency of the system.

23. The method of claim 22, wherein the processing step comprises processing the measured load force in a feedback loop.

24. The method of claim 22, further comprising the step of adjusting the position of the support in response to the measured load force.

25. The method of claim 22, further comprising the step of controlling the actuator to adjust the position of the support.

26. The method of claim 22, further comprising the step of calculating the displacement of the support from the measured load force.

27. The method of claim 26, wherein the displacement of the support is calculated by the relationship:

$$\frac{d}{F} = \frac{1}{M_P s^2 + c_f s + k_f}$$

where d is the displacement of the support;
F is the measured load force;
$M_p$ is the mass of the support;
s is the Laplace transform parameter;
$c_f$ is the flexure damping ratio; and
$k_f$ is the flexure stiffness.

28. The method of claim 22, wherein the load force measuring step comprises using a force sensor to measure the load force, the force sensor generating an output voltage corresponding to the measured load force and wherein the method further comprises the step of calculating the displacement of the support as a proportion of the output voltage.

29. The method of claim 28, wherein the displacement of the support is calculated by the relationship:

$$\frac{d}{V_s} = \frac{d}{g_s F} = \frac{1/g_s}{M_P s^2 + c_f s + k_f}$$

where d is the displacement of the support;
$V_s$ is the output voltage of the measured load force;
F is the measured load force;
$g_s$ is the force sensor gain;
Mp is the mass of the support;
s is the Laplace transform parameter;
$c_f$ is the flexure damping ratio; and
$k_f$ is the flexure stiffness.

30. The method of claim 22, further comprising the step of calibrating the force sensor using the charge and/or the voltage of the force sensor.

31. The method of claim 23, wherein the processing step comprises processing the measured load force in the feedback loop at frequencies above a predetermined cross-over frequency $\omega_c$.

32. The method of claim 31, wherein the cross-over frequency $\omega_c$ is above a cut-off frequency of the force sensor.

33. The method of claim 31, wherein the cross-over frequency $\omega_c$ is determined according to the relationship:

$$\omega_c > \omega_{co} = \frac{1}{R_{in} C}$$

where $\omega_c$ is the cross-over frequency;
$\omega_{co}$ is the cut-off frequency;
$R_{in}$ is the voltage buffer input impedance, and
C is the capacitance of the force sensor.

34. The method of claim 31, further comprising the steps of measuring the position of the support, calculating the displacement of the support from the measured support position and processing the calculated displacement in the feedback loop at frequencies below the predetermined cross-over frequency $\omega_c$.

35. The method of claim 31, further comprising the step of calculating the displacement of the support from the input voltage of the actuator and the open-loop response of the system, and processing the calculated displacement in the feedback loop at frequencies below the predetermined cross-over frequency $\omega_c$.

36. The method of claim 31, further comprising the steps of measuring the displacement of the support and processing the measured displacement in the feedback loop at frequencies below the predetermined cross-over frequency $\omega_c$.

37. The method of claim 23, further comprising the step of processing the measured load force in the feedback loop to increase the damping ratio of the system.

38. The method of claim 23, further comprising the step of adding a feedforward input to the feedback loop to improve the closed-loop response of the system.

39. The method of claim 22, wherein the at least one resonance frequency is the first resonance mode of the system.

40. The method of claim 22, wherein the system comprises multiple resonance modes and the controller damps one or more of the resonance modes.

41. The method of claim 22, wherein the system is a nanopositioning system.

* * * * *